US009262566B2

(12) United States Patent
Kirsanov

(10) Patent No.: US 9,262,566 B2
(45) Date of Patent: Feb. 16, 2016

(54) FAST SIMULATION OF A RADIO FREQUENCY CIRCUIT

(75) Inventor: Danil Kirsanov, Cambridge, MA (US)

(73) Assignee: The MathWorks, Inc., Natick, MA (US)

( * ) Notice: Subject to any disclaimer, the term of this patent is extended or adjusted under 35 U.S.C. 154(b) by 883 days.

(21) Appl. No.: 13/415,927

(22) Filed: Mar. 9, 2012

(65) Prior Publication Data

US 2013/0238292 A1 Sep. 12, 2013

(51) Int. Cl.
*G06F 17/50* (2006.01)
*H04B 17/391* (2015.01)

(52) U.S. Cl.
CPC ........ *G06F 17/5036* (2013.01); *H04B 17/3912* (2015.01)

(58) Field of Classification Search
CPC ........................ G06F 17/5036; H04B 17/3912
See application file for complete search history.

(56) References Cited

U.S. PATENT DOCUMENTS 4,815,024 A * 3/1989 Lewis ............................... 703/4
5,467,291 A * 11/1995 Fan ..................... G06F 17/5036 703/14
5,675,581 A * 10/1997 Soliman ........................ 370/252
5,774,382 A * 6/1998 Tyler et al. ........................ 703/2
5,963,724 A * 10/1999 Mantooth et al. ............... 703/14
6,067,041 A * 5/2000 Kaiser et al. .................. 342/171
6,271,781 B1 * 8/2001 Pellon ........................... 341/143
6,397,173 B1 * 5/2002 Campbell et al. ............... 703/20
6,785,642 B1 * 8/2004 Ballam ........................... 703/14
6,828,909 B2 * 12/2004 Script et al. ................ 340/545.1
7,979,825 B2 * 7/2011 Elfadel et al. ................. 716/111
8,260,600 B1 * 9/2012 Deng et al. ....................... 703/14
8,595,669 B1 * 11/2013 Keller et al. .................. 716/115
8,606,557 B2 * 12/2013 Joshi et al. ...................... 703/13
8,682,631 B2 * 3/2014 Chang et al. .................... 703/13
8,850,377 B1 * 9/2014 Jenkins, IV ......... G06F 17/5036 716/116
2002/0181074 A1 * 12/2002 Seydnejad et al. ............ 359/334
2003/0122123 A1 * 7/2003 Deng et al. ...................... 257/48
2003/0144827 A1 * 7/2003 Yang .............................. 703/20
2003/0188267 A1 * 10/2003 Lehner ................ G06F 17/5036 716/113
2004/0044988 A1 * 3/2004 Schene ......................... 717/106
2004/0049745 A1 * 3/2004 Rahman ............. G06F 17/5036 716/112
2004/0247042 A1 * 12/2004 Sahlman ....................... 375/297
2005/0009479 A1 * 1/2005 Braithwaite ............... 455/114.3
2005/0111575 A1 * 5/2005 Taler et al. .................... 375/297
2005/0140438 A1 * 6/2005 Jin et al. ........................ 330/149
2005/0273298 A1 * 12/2005 Shah ................................ 703/2
2006/0190881 A1 * 8/2006 Su et al. ............................ 716/6
2006/0277511 A1 * 12/2006 Agrawal et al. ................... 716/6

(Continued)

OTHER PUBLICATIONS

"Table Based Models" by Victor Bourenkov et al, Sep. 16, 2005, pp. 1-33.*

(Continued)

*Primary Examiner* — Akash Saxena
(74) *Attorney, Agent, or Firm* — Harrity & Harrity, LLP

(57) ABSTRACT

A system is configured to determine, during a first time period, one or more first output values, of an RF circuit, by solving one or more differential equations using one or more first input values; build, during the first time period, a table based on the one or more first input values and the one or more first output values; receive, during a second time period, one or more second input values for the RF circuit; and determine, during the second time period, one or more second output values, of the RF circuit, using the table and the one or more second input values.

21 Claims, 12 Drawing Sheets

600
605 RECEIVE MODEL THAT INCLUDES A RADIO FREQUENCY (RF) BLOCK
610 OBTAIN SET UP INFORMATION
615 RECEIVE REQUEST TO PERFORM A SIMULATION USING THE RF BLOCK
620 RECEIVE ONE OR MORE FIRST INPUT VALUES DURING A FIRST TIME PERIOD
625 GENERATE ONE OR MORE FIRST OUTPUT VALUES, OF THE RF BLOCK, BY SOLVING ONE OR MORE EQUATIONS, ASSOC W/ THE RF BLOCK, BASED ON THE ONE OR MORE FIRST INPUT VALUES
630 BUILD LOOKUP TABLE BASED ON THE ONE OR MORE FIRST INPUT VALUES AND THE ONE OR MORE FIRST OUTPUT VALUES
635 HAS FIRST TIME PERIOD EXPIRED? NO / YES
640 RECEIVE ONE OR MORE SECOND INPUT VALUES DURING SECOND TIME PERIOD
645 IDENTIFY ONE OR MORE SECOND OUTPUT VALUES OF THE RF BLOCK USING THE LOOKUP TABLE AND THE ONE OR MORE SECOND INPUT VALUES
END SIMULATION

1000
INPUT COMPONENTS 1010
OUTPUT COMPONENTS 1020
Y1A Y1B ...
X1A dY1A/dX1A dY1B/dX1A
X1B dY1A/dX1B dY1B/dX1B
X1C dY1A/dX1C dY1B/dX1C
SENSITIVITY INFORMATION 1030
1032 1034 1036

(56) References Cited

U.S. PATENT DOCUMENTS

| | | | | |
|---|---|---|---|---|
| 2007/0050758 | A1* | 3/2007 | Arevalo et al. | 717/135 |
| 2007/0078638 | A1* | 4/2007 | McDonald et al. | 703/14 |
| 2007/0136706 | A1* | 6/2007 | Hwang et al. | 716/6 |
| 2007/0143719 | A1* | 6/2007 | Chopra et al. | 716/4 |
| 2008/0114572 | A1* | 5/2008 | Feldmann et al. | 703/2 |
| 2009/0119085 | A1* | 5/2009 | Ma et al. | 703/14 |
| 2009/0248335 | A1* | 10/2009 | Elfadel et al. | 702/65 |
| 2010/0198539 | A1* | 8/2010 | Li et al. | 702/65 |
| 2012/0302179 | A1* | 11/2012 | Brobston | H03F 1/0266 455/73 |
| 2014/0096099 | A1* | 4/2014 | Phillips et al. | 716/113 |
| 2015/0195631 | A1* | 7/2015 | Forrester | H04M 1/03 381/345 |
| 2015/0263686 | A1* | 9/2015 | Lesso | H03M 1/0624 341/144 |

OTHER PUBLICATIONS

Rewieński, "A Perspective on Fast-Spice Simulation Technology", 2011, pp. 23-41, XP002691201.

Notification of Transmittal of the International Search Report and the Written Opinion of the International Searching Authority, or the Declaration corresponding to PCT/US2012/058005, mailed Feb. 12, 2013, 10 pages.

Cai, Q. and Feng, D.: "Speed Up RF Mixed-Signal Simulation Using Novel Hierarchical Fast Envelope Simulation"; Cadence Design Systems, Inc.; Session 6.7; presented at "cadence designer network", Silicon Valley, 2007; 14 pages.

"GoldenGate RFIC Simulation Software", Keysight Technoligies (Agilent), http://www.keysight.com/en/pc-1297119/goldengate-rfic-simulation-software?cc=US&lc=e, (Sep. 3, 2015—Print Date), 2 pages.

* cited by examiner

800

| FREQUENCY 805 | | | |
|---|---|---|---|
| | TIME STEP 810 | INPUT 815 | OUTPUT 820 |
| 822 | T1 | X1 | Y1 |
| 824 | T2 | X2 | Y2 |
| 826 | T3 | X3 | Y2 |
| | | • • • | |

Fig. 8

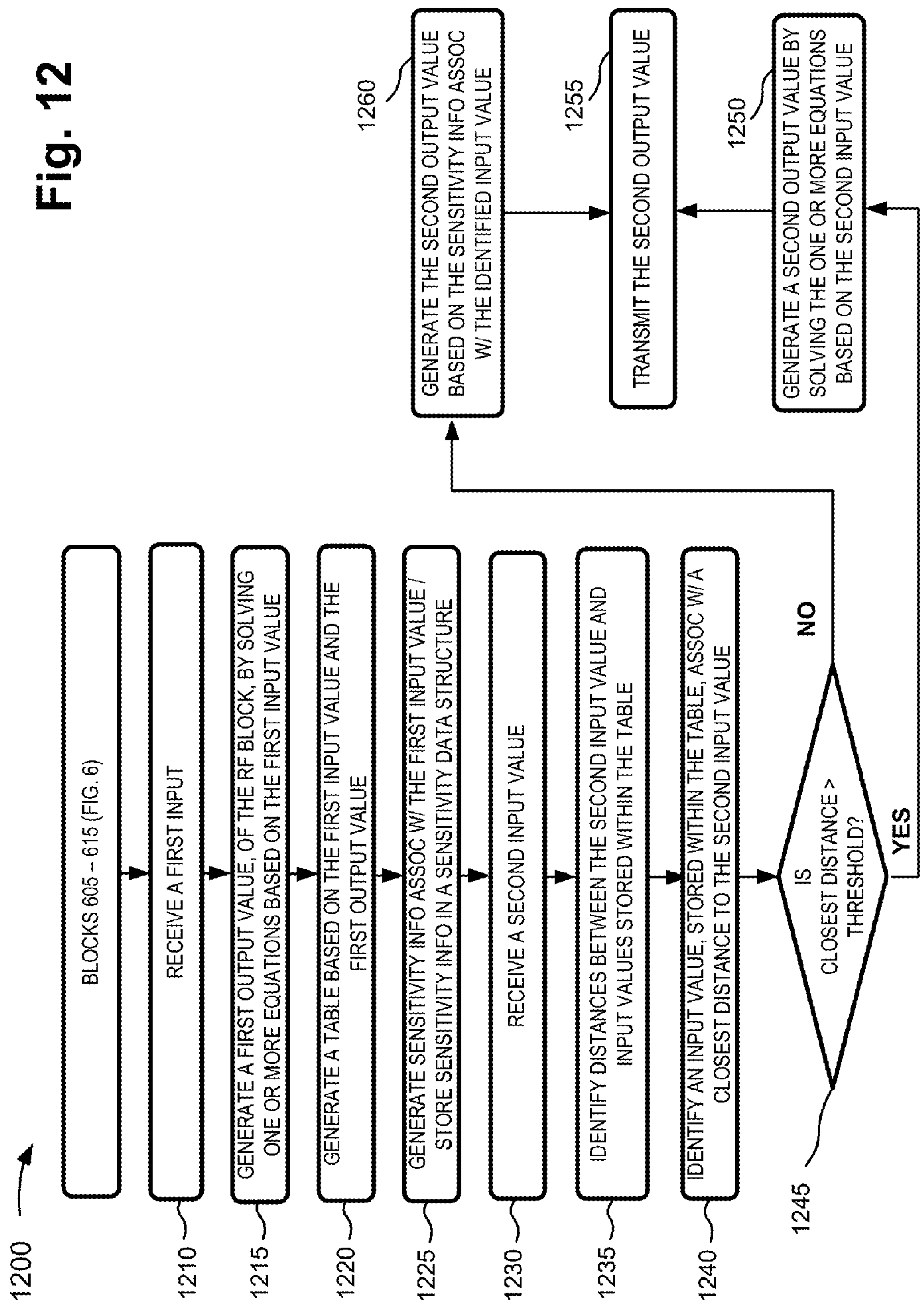
Fig. 12
1200
BLOCKS 605 – 615 (FIG. 6)
1210
RECEIVE A FIRST INPUT
1215
GENERATE A FIRST OUTPUT VALUE, OF THE RF BLOCK, BY SOLVING ONE OR MORE EQUATIONS BASED ON THE FIRST INPUT VALUE
1220
GENERATE A TABLE BASED ON THE FIRST INPUT VALUE AND THE FIRST OUTPUT VALUE
1225
GENERATE SENSITIVITY INFO ASSOC W/ THE FIRST INPUT VALUE / STORE SENSITIVITY INFO IN A SENSITIVITY DATA STRUCTURE
1230
RECEIVE A SECOND INPUT VALUE
1235
IDENTIFY DISTANCES BETWEEN THE SECOND INPUT VALUE AND INPUT VALUES STORED WITHIN THE TABLE
1240
IDENTIFY AN INPUT VALUE, STORED WITHIN THE TABLE, ASSOC W/ A CLOSEST DISTANCE TO THE SECOND INPUT VALUE
1245
IS CLOSEST DISTANCE > THRESHOLD?
NO
YES
1250
GENERATE A SECOND OUTPUT VALUE BY SOLVING THE ONE OR MORE EQUATIONS BASED ON THE SECOND INPUT VALUE
1255
TRANSMIT THE SECOND OUTPUT VALUE
1260
GENERATE THE SECOND OUTPUT VALUE BASED ON THE SENSITIVITY INFO ASSOC W/ THE IDENTIFIED INPUT VALUE

FAST SIMULATION OF A RADIO FREQUENCY CIRCUIT

BRIEF DESCRIPTION OF THE DRAWINGS

The accompanying drawings, which are incorporated in and constitute a part of this specification, illustrate one or more implementations described herein and, together with the description, explain these implementations. In the drawings:

FIG. 8 is diagram of an example lookup table that may store input values to and/or output values from a RF block associated with a RF circuit;

FIG. 12 is a flow chart of an example process for performing a simulation of a RF circuit with dynamic lookup table updating based on sensitivity information.

DETAILED DESCRIPTION

Figure 1:
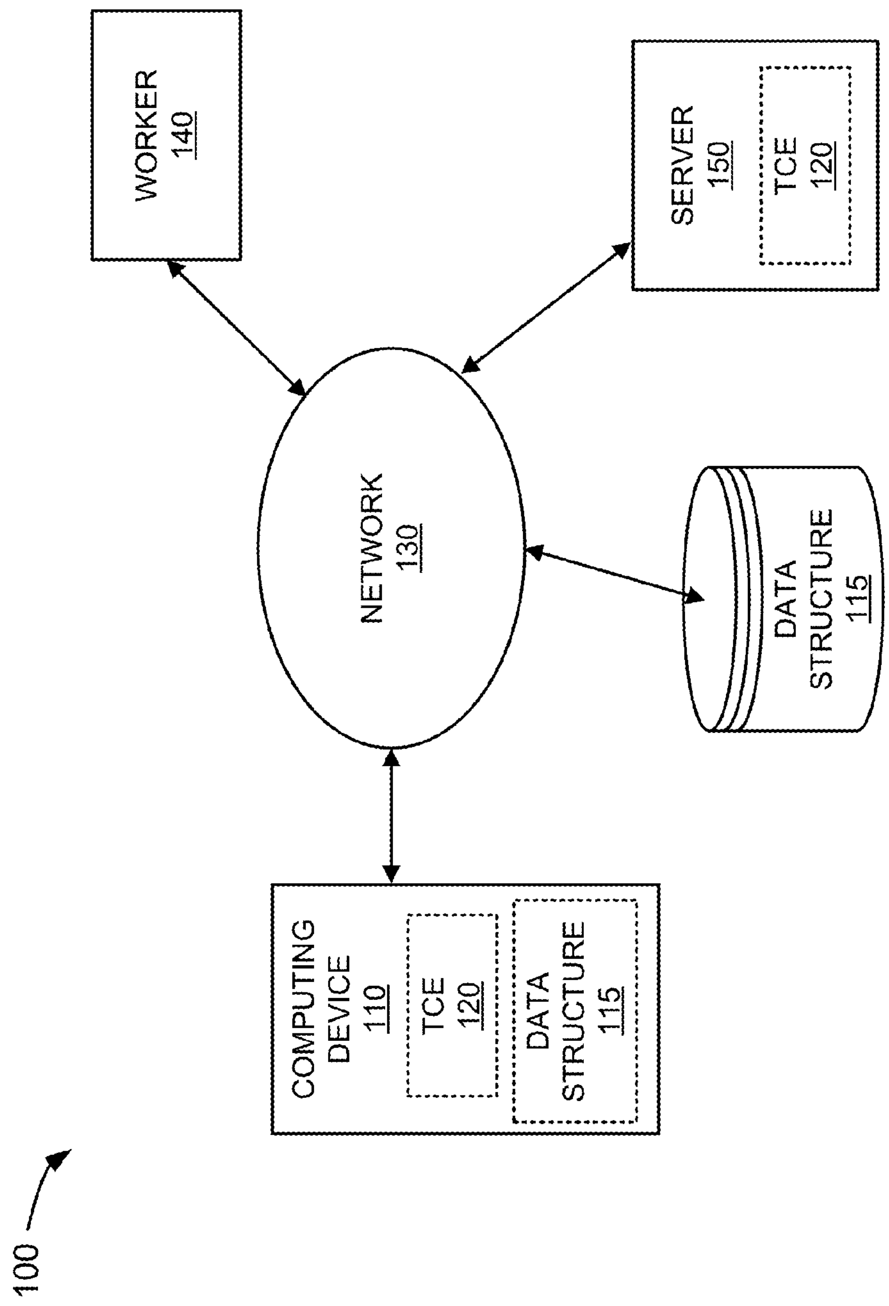
FIG. 1 is a diagram of an example environment in which systems and/or methods described herein may be implemented.

The following detailed description refers to the accompanying drawings. The same reference numbers in different drawings may identify the same or similar elements.

A system and/or method, described herein, may allow operation of a radio frequency (RF) circuit to be simulated by a technical computing environment (TCE) using a mathematical model that is based on a RF block. The RF block may allow the RF circuit to be simulated in a number of ways. The RF block may, for example, be associated with a set of mathematical equations (e.g., non-linear differential algebraic equation) that represent a set of components, devices, and/or features associated with the RF circuit. The RF circuit may usually be simulated by executing programming code that uses numerical methods to solve the equations. Additionally, or alternatively, the RF block may represent a programming code that allows simulation of the RF circuit to be performed using one or more other known methods in the time domain, the frequency domain, or a combination of the time domain and the frequency domain. These methods may include, for example, a transient envelope following method, modulated-oriented harmonic balance method, a Fourier collocation method, a hierarchical approach, etc. Each of these methods may be time intensive resulting in simulations being performed over a period of time that may span hours, days, weeks, etc. and which may occupy one or more network devices within a network. The system and/or method may allow the RF circuit to be simulated in less time than these techniques by making use of a data structure (hereinafter referred to as a lookup table).

The TCE may, during a first portion of a simulation of the RF circuit (sometimes referred to as a training phase of the simulation), simulate the operation of the RF circuit by executing the RF block using input values provided to the RF block. The TCE may, when executing the RF block, solve the set of mathematical equations, using the input values, to generate output values. The TCE may, during the training phase, build a lookup table based on the input values and corresponding output values.

The TCE may, during a second portion of the simulation (sometimes referred to as a lookup phase of the simulation), simulate the operation of the RF circuit by performing a lookup operation using the lookup table. The TCE may, during the lookup phase, receive an input value and may identify a stored input value, within the lookup table, that corresponds to the received input value. Based on the identification of the stored input value, the TCE may identify a stored output value, within the lookup table, that corresponds to the stored input value. The TCE may output an output value that is based on the stored output value. The output value, based on the lookup operation, may approximate an output value that is generated by solving the mathematical equations based on the input value.

Performing the simulation, using the lookup operation, may increase a speed at which the simulation is performed compared to performing the simulation without using the lookup operation. Thus, the amount of time to perform the simulation may be reduced. For example, performing the simulation based on the lookup operation may be performed in less time than performing the simulation based on solving the mathematical equations. Additionally, or alternatively, a greater quantity of output values may be generated, within a time period, during the lookup operation than are generated, within a same time period, by solving the mathematical equations. The increase in the speed of the simulation may be attributable to the lookup operation being computationally less complex (e.g., fewer computations, fewer computer cycles, less processing time, etc.) than solving the mathematical equations. Additionally, or alternatively, the increase in speed may be attributable to the output value, obtained by performing the lookup operation, being an approximation of an output value obtained by solving the mathematical equations.

A portion of the simulation associated with the training phase and/or the lookup phase may be specified by an operator of the technical computing application. The operator may, for example, specify at what point in time and/or under what conditions is the simulation to change from being performed by solving the mathematical equations, to being performed by performing a lookup operation.

Additionally, or alternatively, the TCE may, during the training phase, generate sensitivity information based on input values to the RF block and corresponding output values from the RF block. The sensitivity information may be based on a measure of sensitivity between a change in the input values relative to a change in the output values. The sensitivity information may be used to dynamically determine whether to perform the simulation by solving the mathematical equations or by performing a lookup operation. The TCE may, for example, cause the simulation to dynamically change from the training phase, to the lookup phase, when the measure of sensitivity is less than a threshold. Additionally, or alternatively, the TCE may cause the simulation to dynamically change from the lookup phase, to the training phase, when the measure of sensitivity is not less than the threshold. In this way, the sensitivity information may control a degree of approximation that is permitted for an output value that is obtained based on performing the lookup operation.

Embodiments may use computing environments, such as TCEs for performing computing operations. A TCE may include any hardware and/or software based logic that provides a computing environment that allows tasks to be performed (e.g., by users) related to disciplines, such as, but not limited to, mathematics, science, engineering, medicine, and business. The TCE may include text-based environments (e.g., MATLAB® software), a graphically-based environment (e.g., Simulink® software, Stateflow® software, SimEvents™ software, etc., by The MathWorks, Inc.; VisSim by Visual Solutions; LabView® by National Instruments; etc.), or another type of environment, such as a hybrid environment that may include, for example, one or more of the above-referenced text-based environments and one or more of the above-referenced graphically-based environments.

The TCE may be integrated with or operate in conjunction with a graphical modeling environment, which may provide graphical tools for constructing models or systems or processes. The TCE may include additional tools, such as tools designed to convert a model into an alternate representation, such as source computer code, compiled computer code, or a hardware description (e.g., a description of a circuit layout). In an implementation, the TCE may provide this ability using graphical toolboxes (e.g., toolboxes for signal processing, image processing, color manipulation, data plotting, parallel processing, etc.). In another implementation, the TCE may provide these functions as block sets. In still another implementation, the TCE may provide these functions in another way.

Models generated with the TCE may be, for example, models of a physical system, a computing system, an engineered system, an embedded system, a biological system, a chemical system, etc.

As previously mentioned, an example embodiment of the TCE may use one or more text-based products, such as textual modeling environments. For example, a text-based modeling environment, may be implemented using products such as, but not limited to, MATLAB by The MathWorks, Inc.; Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some embodiments, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In an implementation, the text-based modeling environment may include a dynamically typed language that may be used to express problems and/or solutions in mathematical notations familiar to those of skill in the relevant arts. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on whole aggregations of data without having to resort to explicit loops of individual non-array, i.e., scalar operations.

The modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

In another example embodiment, the TCE may be implemented in a graphically-based modeling environment using products such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment.

Example Environment

FIG. 1 is diagram of an example environment 100 in which concepts described herein may be implemented. Environment 100 may include a computing device 110, a data structure 115, a technical computing environment (TCE) 120, a network 130, a worker 140, and a server 150. The quantity of devices and/or networks, illustrated in FIG. 1, is provided for explanatory purposes only. In practice, there may be additional devices and/or networks; fewer devices and/or networks; different devices and/or networks; and/or differently arranged devices and/or networks than illustrated in FIG. 1.

Also, in some implementations, one or more of the devices and/or networks, of environment 100, may perform one or more functions described as being performed by another one or more of the devices and/or networks of environment 100. Devices of environment 100 may interconnect via wired connections, wireless connections, or a combination of wired and wireless connections.

Computing device 110 may include one or more devices (e.g., a personal computer, a laptop, a tablet computer, a server device, a wireless device, such as a mobile phone, a smart phone, or a personal digital assistant (PDA), or the like), or other types of computation or communication devices, that gather, process, search, store, and/or provide information in a manner similar to that described herein. In one example implementation, computing device 110 may host TCE 120 and may execute TCE 120 to simulate operation of a radio frequency (RF) circuit. Additionally, or alternatively, computing device 110 may perform the simulation by causing one or more instantiations, of a TCE, to execute by communicating with worker 140 and/or by accessing a TCE service by communicating with server 150. Computing device 110 may host data structure 115 and/or may access data structure 115 that is remote from computer device 110.

Data structure 115 may include one or more devices that store information and/or data. Data structure 115 may, in response to a request from computing device 110, store and/or retrieve a model associated with a RF circuit that can be used to simulate operation of the RF circuit. Data structure 115 may also, or alternatively, store a lookup table that can be used to simulate the RF circuit. The lookup table may include input values to and/or corresponding output values from the model. Data structure 115 may be located within computing device 110 or remote from computing device 110.

TCE 120 may include an application that is stored on and/or executed by computing device 110. TCE 120 may provide, for display on computing device 110, a user interface that enables design, analysis, and generation of, for example, technical applications, engineered systems, and/or business applications. For example, TCE 120 may provide a numerical and/or symbolic computing environment that allows for matrix manipulation, plotting of functions and data, implementation of algorithms, creation of user interfaces, and/or interfacing with programs in other languages. TCE 120 may include a graphical modeling component and a component to convert graphic models into other forms, such as computer source code (e.g., C++ code) or hardware descriptions (e.g., a description of an electronic circuit). TCE 120 may be run by multiple networked computing devices 110. In such an implementation, TCE 120 may be executed in a distributed manner, such as by executing on multiple computing devices 110 simultaneously.

TCE 120 may, for example and when executed by computing device 110, allow a radio frequency (RF) circuit to be simulated based on a model. The model may include a RF block associated with a set of mathematical equations, such as differential equations, that represent components, devices, and/or features associated with the RF circuit. The RF block may also, or alternatively, be associated with programming code that, when executed, performs operations associated with simulating the RF circuit. The RF block may, when executed by TCE 120, cause the programming code to execute and/or the set of mathematical equations to be solved, which may allow operation of the RF circuit to be simulated or analyzed. TCE 120 may also, or alternatively, allow input values to the RF block and output values generated by the RF block to be used to build a lookup table. The lookup table may store input values to, and/or output values generated by, the RF block. TCE 120 may use the lookup table to perform a lookup operation to simulate or analyze operation of the RF circuit without executing the RF block. Simulating the RF circuit based on the lookup operation may be performed in less time than simulating the RF circuit by executing the programming code and/or solving the mathematical equations. Performing the simulation in less time may be attributable to the lookup operation being computationally less complex than execution of the RF block. Additionally, or alternatively, performing the simulation in less time may be attributable to output values, based on lookup operation, being an approximation of output values obtained by executing the RF block.

Network 130 may include one or more wired and/or wireless networks. For example, network 130 may include a cellular network, the Public Land Mobile Network (PLMN), a public switched telephone network (PSTN), and/or a second generation (2G) network, a third generation (3G) network, a fourth generation (4G) network, a fifth generation (5G) network, and/or another network (e.g., a long term evolution (LTE) network). Additionally, or alternatively, network 130 may include a local area network (LAN), a wide area network (WAN), a metropolitan area network (MAN), an ad hoc network, an intranet, the Internet, and/or a combination of these or other types of networks.

Worker 140 may include one or more devices (e.g., a personal computer, a laptop, a tablet computer, a server device, a wireless device, such as a mobile phone, a smart phone, or a personal digital assistant (PDA), or the like), or other types of computation or communication devices running one or more instantiations of a TCE. In one example implementation, worker 140 may include a remotely located computing device 110 running TCE 120. In an embodiment, worker 140 may be a virtual instance of TCE 120 running on a processing device, such as server 150, alone or in combination with other instances of workers.

Server 150 may include one or more server devices or other types of computation or communication devices that provide access to a TCE, as a remote service, via network 130. In one example implementation, server 150 may host TCE 120 and may execute TCE 120 to simulate operation of a radio frequency (RF) circuit. Server 150 may provide results of the simulation to user device 110 and/or may publish the results as a service to be subscribed to by user device 110. Additionally, or alternatively, access to TCE 120 may be provided as a web service. The web service may provide access to one or more programs provided by server 150.

Figure 2:
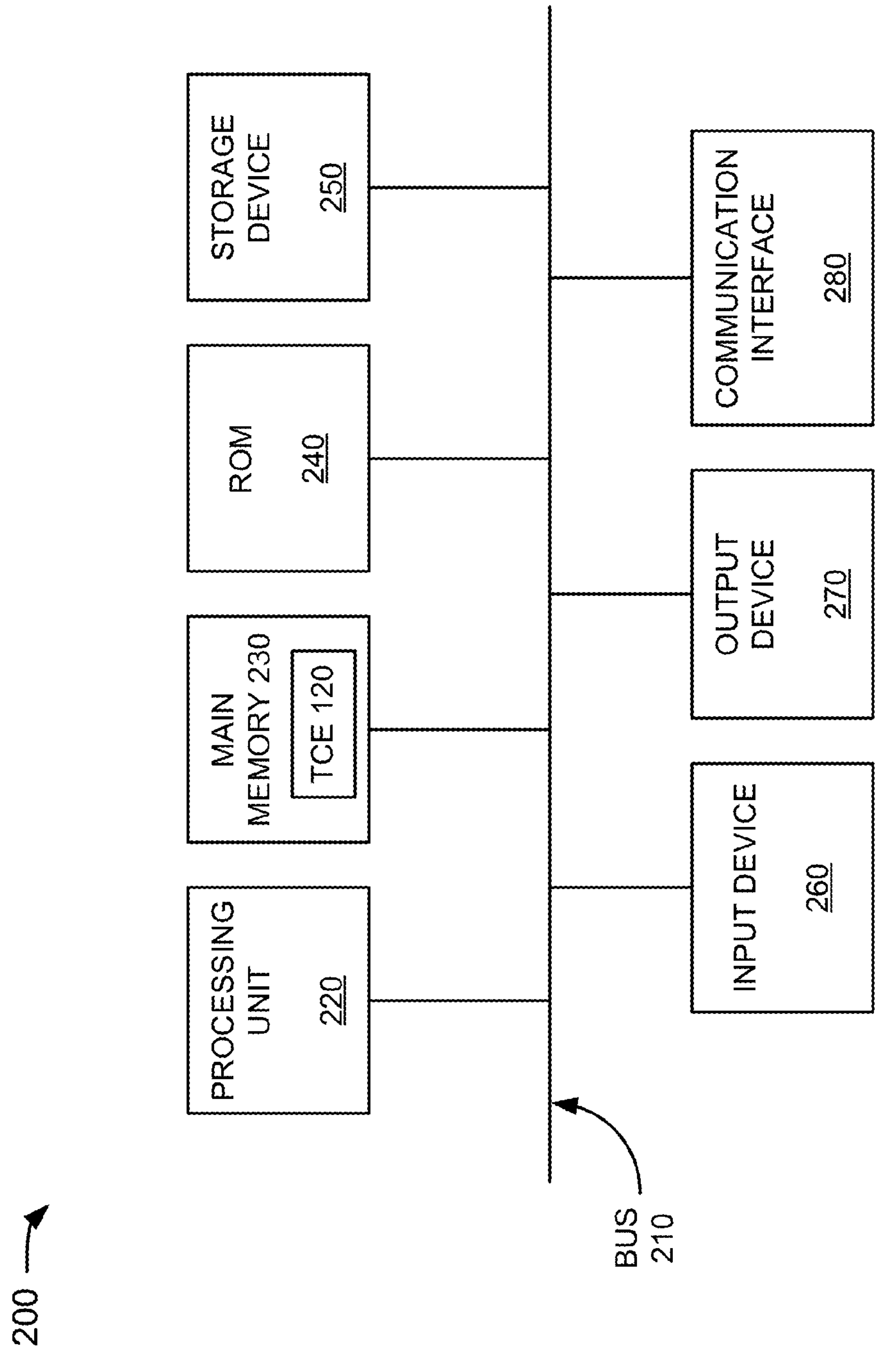
FIG. 2 is a diagram of example device that may correspond to one or more devices of FIG. 1.

FIG. 2 is a diagram of an example device 200 that may correspond to computing device 110, worker 140, and/or server 150. As illustrated, device 200 may include a bus 210, a processing unit 220, a main memory 230, a read-only memory (ROM) 240, a storage device 250, an input device 260, an output device 270, and/or a communication interface 280. Bus 210 may include a path that permits communication among the components of device 200.

Processing unit 220 may include a processor, a microprocessor, or other types of processing logic that may interpret and/or execute instructions. Main memory 230 may be a tangible non-transitory computer-readable medium, such as a random access memory (RAM) or another type of dynamic storage device that may store information and instructions for execution by processing unit 220 (e.g., instructions implementing TCE 120). ROM 240 may include a read only memory (ROM) device or another type of static storage device that may store static information and/or instructions for use by processing unit 220. Storage device 250 may include a magnetic and/or optical recording medium and its corresponding drive. In some implementations, main memory 230 or storage device 250 may also be implemented as solid state memory, such as flash-based memory.

Input device 260 may include a mechanism that permits an operator to input information to device 200, such as a keyboard, a mouse, a pen, a single or multi-point touch interface, an accelerometer, a gyroscope, a microphone, voice recognition and/or biometric mechanisms, etc. Output device 270 may include a mechanism that outputs information to the operator from device 200, including a display, a printer, a speaker, etc. In the case of a display, the display may be a touch screen display that acts as both an input and an output device. Moreover, input device 260 and/or output device 270 may be haptic type devices (e.g., joysticks), tactile sensors, or other devices based on touch.

Communication interface 280 may include a transceiver-like mechanism that enables device 200 to communicate with other devices and/or systems. For example, communication interface 280 may include mechanisms for communicating with another device or system via a network.

As will be described in detail below, device 200 may perform certain operations relating to the simulation of a RF circuit. Device 200 may perform these operations in response to processing unit 220 executing software instructions contained in a computer-readable medium, such as memory 230. A computer-readable medium may be defined as a non-transitory memory device. A memory device may include space within a single physical memory device or spread across multiple physical memory devices.

The software instructions may be read into main memory 230 from another computer-readable medium, such as storage device 250, or from another device via communication interface 280. The software instructions contained in main memory 230 may cause processing unit 220 to perform processes that will be described later. Alternatively, hardwired circuitry may be used in place of or in combination with software instructions to implement processes described herein. Thus, implementations described herein are not limited to any specific combination of hardware circuitry and software.

Although FIG. 2 shows example components of device 200, in other implementations, device 200 may contain fewer components, different components, differently arranged components, or additional components than depicted in FIG. 2. Alternatively, or additionally, one or more components of device 200 may perform one or more tasks described as being performed by one or more other components of device 200.

Example Logical Blocks

Figure 3:
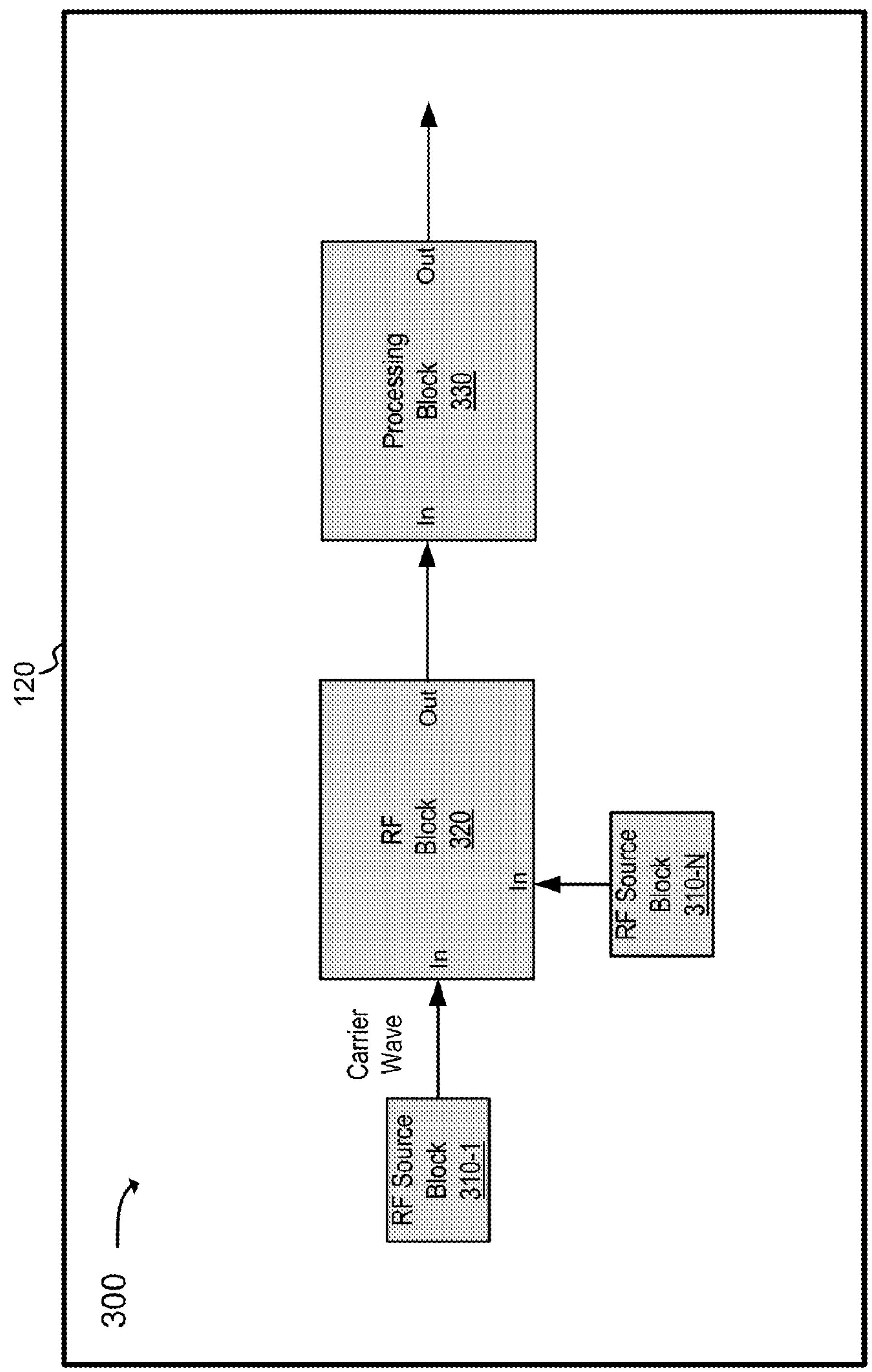
FIG. 3 is a diagram of example logical blocks that may be associated with a model of a radio frequency (RF) circuit.

FIG. 3 is a diagram of example logical blocks that may be associated with a model 300 of a RF circuit. In an example implementation, Model 300 may include logical blocks that represent a RF circuit. As illustrated in FIG. 3, model 300 may include a set of logical blocks, such as a group of radio frequency (RF) source blocks 310-1, . . . , 310-N (where N≥1) (hereinafter referred to collectively as RF source blocks 310 and individually as RF source block 310), a RF block 320, and a processing block 330. The quantity of logical blocks within model 300 is included for explanatory purposes only. In another implementation, model 300 may include additional logical blocks, fewer logical blocks, different logical blocks, or differently arranged logical blocks than are described with respect to FIG. 3.

RF source block 310 may include logic that allows input to be provided to RF block 320. The input may include one or more input values that change as a function of time. For example, the input may represent a signal (e.g., a RF signal) that is provided to a RF circuit. Additionally, or alternatively, the input values may represent a complex signal that identifies signal parameters associated with the signal, such as a signal amplitude (e.g., a voltage level, a power level, etc.), a carrier frequency, a phase, a polarization (e.g., transverse electric (TE), transverse magnetic (TM), etc.), a quadrature angle, a real in-phase component, an imaginary quadrature component, etc. Additionally, or alternatively, the input signal may be provided in discrete time steps, where each time step may include a set of instantaneous values that correspond to the signal parameters.

RF block 320 may include one or more functional components, representing components of a RF circuit that receive input from RF source block 310. The functional components may, for example, include logic that, when executed based on the input, simulate a manner in which the components of the RF circuit are likely to operate based on an input signal. RF block 320 may, when executed based on the input, generate output to be provided to processing block 330. RF block 320 will be described in greater detail below with respect to FIG. 4.

Processing block 330 may include one or more functional components that receive output from RF block 320 and perform processing on the output. In an example implementation, processing block 330 may represent an analog-to-digital converter (ADC) that receives an analog signal as output from RF block 320, and convert the analog signal to a digital signal that can be processed further by processing block 330 and/or another logical block. Additionally, or alternatively, processing block 330 may perform another function on output received from RF block 320.

Figure 4:
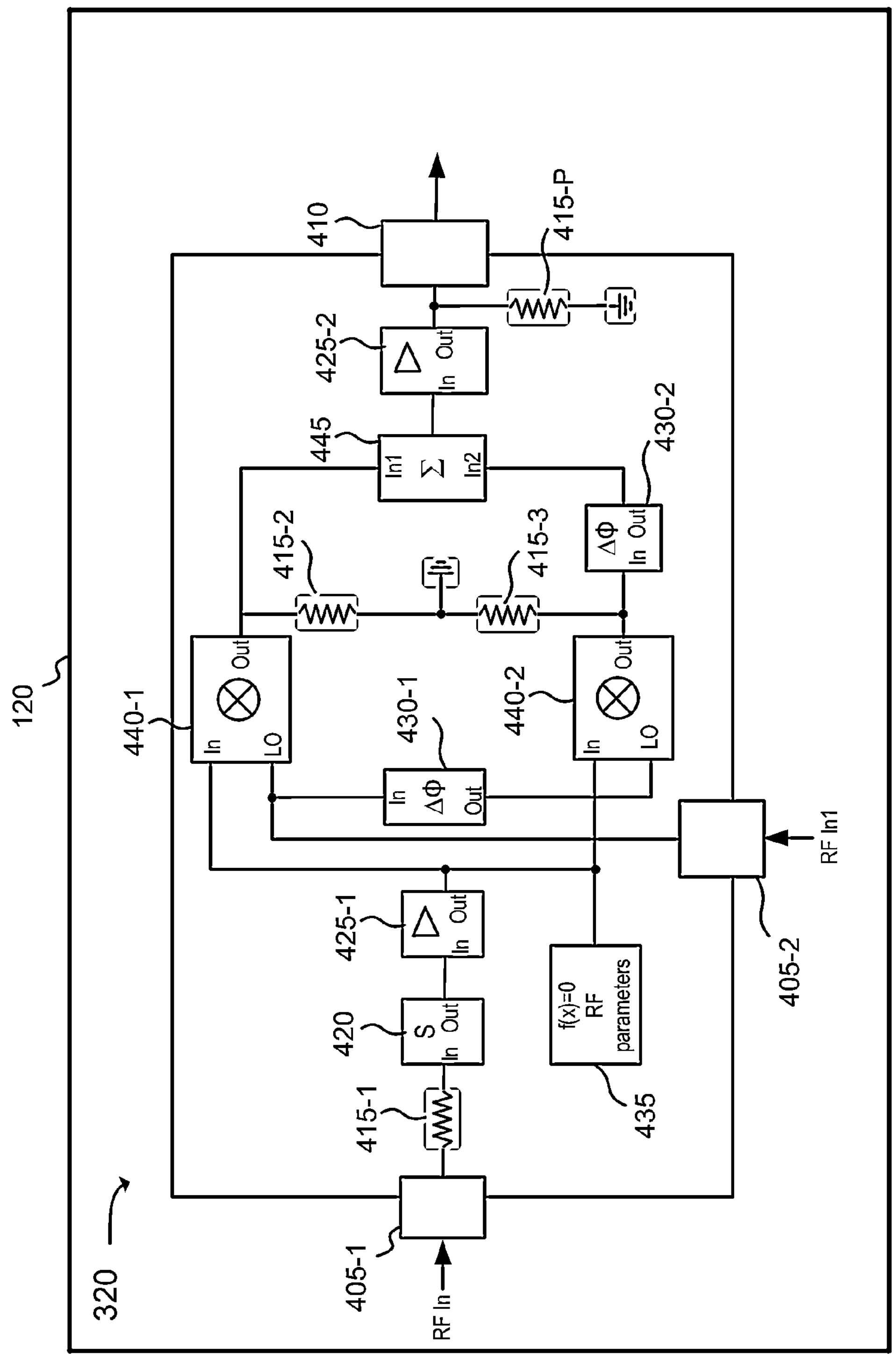
FIG. 4 is a diagram of example functional components that may be associated with a RF block of FIG. 3.

FIG. 4 is a diagram of example functional components that may be associated with RF block 320. RF block 320 may include a set of functional components, such as, for example, a pair of input port components 405-1 and 405-2, an output port component 410, a group of load components 415-1, . . . , 415-P (where P≥1) (hereinafter referred to collectively as load components 415 and individually as load component 415), a filter component 420, a pair of amplifier components 425-1 and 425-2, a pair of phase shifter components 430-1 and 430-2, a parameter source component 435, a pair of mixer components 440-1 and 440-2, and a combiner component 445. The quantity of functional components within RF block 320 is included for explanatory purposes only. In another implementation, RF block 320 may include additional functional components, fewer functional components, different functional components, or differently arranged functional components than are described with respect to FIG. 4.

Input port component 405 (e.g., input ports 405-1 and/or 405-2) may enable RF block 320 to receive input from RF source block 310 and provide the received input to functional components associated with RF block 320. The input may, for example, be received at discrete time steps and may be sent, by input port component 405, to one or more functional components within RF block 320. For example, input port 405-1 may receive a first input and may send the first input to load component 415-1. Additionally, or alternatively, input port 405-2 may receive a second input and may send the second input to mixer 440-1. Output port component 410 may allow RF block 320 to send output, received from amplifier 425-2, to processing block 330.

Load component 415 may represent a load, associated with a type and/or quantity of impedance (e.g., resistance, capacitance, inductance, etc.), that operates on one or more signals traveling between components within a RF circuit that is represented by RF block 320. Each load component 415 may be associated with a respective mathematical equation (e.g., a differential equation and/or some other type of mathematical equation) that represents a respective impedance. The mathematical equation may simulate a manner in which a load operates on a received signal within the RF circuit.

Filter component 420 may represent a filter that filters a received signal, within the RF circuit, by attenuating (e.g., in the frequency domain and/or time domain) a portion of a received signal. Filter component 420 may be associated with a mathematical equation (e.g., a differential equation and/or some other mathematical equation) that simulates a filter that causes a waveform, associated with a received signal, to be modified to create another waveform that conforms to a format that can be processed by the RF circuit. Amplifier component 425 may represent an amplifier that amplifies a received signal within the RF circuit. Amplifier component 425 may be associated with a mathematical equation (e.g., a differential equation and/or some other type of mathematical equation) that simulates an amplifier that causes a power level, of a received signal, to be amplified to another power level.

Phase shifter component 430 may represent a phase shifter component, within the RF circuit, that modifies a phase, associated with a received signal. Phase shifter component 430 may be associated with a mathematical equation (e.g., a differential equation and/or some other type of mathematical equation) that simulates a phase shifter component that causes a phase angle, of a received signal, to be modified to create a signal with a different phase angle before being mixed or combined with another signal.

Parameter source component 435 may represent a signal source, within the RF circuit, that generates a signal based on a mathematical function to be used to process an input signal received by the RF circuit. The function may be specified by an operator of TCE 120. Additionally, or alternatively, parameter source component 435 may be associated with a mathematical equation (e.g., based on f(x), a differential equation, and/or some other mathematical equation) that simulates a signal source generating a signal associated with one or more parameters (e.g., amplitude, frequency, phase, quadrature angle, etc) to be used to process input signals received by the RF circuit.

Mixer component 440 may represent a mixer device, within the RF circuit, that mixes a first signal with a second signal to create a mixed signal. A first mixer component (e.g., mixer component 440-1) may be associated with a mathematical equation (e.g., a differential equation and/or some other mathematical equation) that simulates a first mixer device causing a first received signal to be combined with a second received signal, associated with a first phase, to generate a first mixed signal. The first mixed signal may, in one example, correspond to a real, in-phase component of a signal. Additionally, or alternatively, a second mixer component (e.g., mixer component 440-2) may be associated with another mathematical equation (e.g., a differential equation and/or some other mathematical equation) that simulates a second mixer device causing the first received signal to be combined with a second received signal, associated with a second phase, to generate a second mixed signal. The second mixed signal may, in one example, correspond to an imaginary, quadrature component of a signal.

Combiner component 445 may represent a combiner device, within the RF circuit, that combines a third signal with a fourth signal to create a combined signal. Combiner component 445 may, for example, be associated with a mathematical equation (e.g., a differential equation and/or some other mathematical equation) that simulates a combiner device causing a first mixed signal, received from a device that corresponds to mixer component 440-1, to be combined with the second mixed signal, that has been phase shifted by a device that corresponds to component 430-2, to create, in one example, a complex signal for output to an amplifier that corresponds to amplifier component 425-2. The complex signal may include the real and imaginary components associated with the first mixed signal and the second mixed signal, respectively.

Example User Interface

Figure 5:
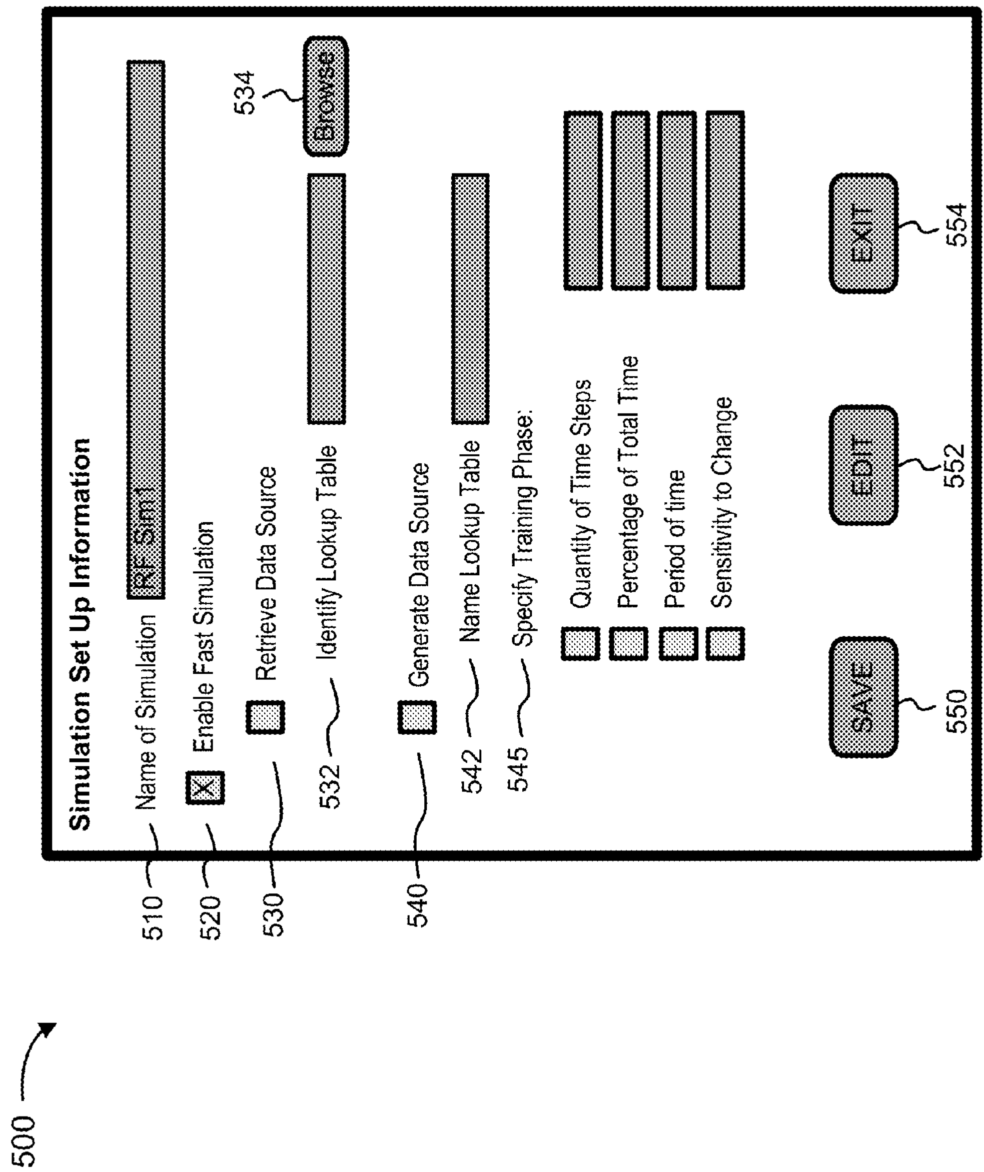
FIG. 5 is a diagram of an example user interface via which information, for setting up a simulation of a RF circuit, may be received.

FIG. 5 is a diagram of an example user interface 500 via which information, for setting up a simulation of a RF circuit, may be received. User interface 500 may be provided, for display on computing device 110, to permit an operator, of computing device 110, to set parameters with respect to simulating a RF circuit. As illustrated in FIG. 5, user interface 500 may include a collection of fields and/or buttons, such as a simulation name field 510, an enable fast simulation field 520, a retrieve data source field 530, a generate data source field 540, a save button 550, an edit button 552, and an exit button 554. The quantity of fields and/or buttons within user interface 500 is included for explanatory purposes only. In another implementation, user interface 500 may include additional fields and/or buttons, fewer fields and/or buttons, different fields and/or buttons, or differently arranged fields and/or buttons than are described with respect to FIG. 5.

Simulation name field 510 may allow an operator, of computing device 110, to enter information that identifies a simulation to be performed on a RF circuit. The information that identifies the simulation may, for example, include a unique simulation identifier (e.g., a name, a filename, etc.), etc. Enable fast simulation field 520 may, when selected by the operator, allow a simulation of a RF circuit to be performed by executing RF block 320 (e.g., by solving one or more mathematical equations associated with RF block 320) and based on a lookup operation using a lookup table that is generated based on executing RF block 320.

Retrieve data source field 530 may, when selected by the operator, allow the operator to identify an existing lookup table to be used to perform the simulation. For example, the operator may enter, into identify lookup table field 532, information associated with the lookup table, such as a name of the lookup table (e.g., a table identifier, a filename, etc.), a location, within data structure 115 and/or within a memory associated with computing device 110, where the lookup table is stored, etc. Additionally, or alternatively, the operator may select browse button 534 to identify the location where the lookup table is stored and/or can be accessed when performing a lookup operation associated with the simulation of the RF circuit.

Generate data source field 540 may, when selected by the operator, allow the operator to enter information associated with a lookup table (e.g., a table identifier, a filename, a storage location, etc.) to be generated when executing RF block 320. Additionally, or alternatively, the operator may enter, into training phase field 545, information that identifies a manner in which a training phase, associated with the simulation, is to be performed to build the lookup table. For example, the operator may select a first field that allows the operator to enter a quantity of time steps (e.g., 50, 100, 500, 1000, 10,000, etc.) to be used to build the lookup table. Additionally, or alternatively, the operator may select a second field that allows the operator to enter a percentage of total simulation time (e.g., 10%, 25%, 50%, 75%, etc.) to be used to build the lookup table. The total simulation time may correspond to an estimated time period, associated with executing RF block 320 and/or performing a lookup operation (e.g., using the lookup table), for all time steps associated with the simulation.

Additionally, or alternatively, the operator may select a third field that allows the operator to enter a period of time (e.g., 10 minutes, 30 minutes, 60 minutes, 6 hours, 12 hours, 24 hours, etc.) to be used to build the lookup table. Additionally, or alternatively, the operator may select a fourth field that allows the operator to specify that the training period is to be performed based on a measure of sensitivity to change with respective input values to RF block 320 relative to output values of RF block 320. The user may, for example, enter information that identifies a threshold to be used to determine whether the measure of sensitivity triggers a lookup operation (e.g., when the measure of sensitivity is less than the threshold) or executing RF block 320 (e.g., when the measure of sensitivity is not less than the threshold). Selection of the fourth field may, thus, allow the simulation to be performed in a manner that dynamically alternates between executing RF block 320 or performing the lookup operation based on whether the measure of sensitivity is less than the threshold. If the operator does not select any of the fields associated with training phase field 545, a default scheme may be predetermined by TCE 120. For example, the default scheme may be based on the second field which identifies a default percentage of total time of the simulation. In another example, the default scheme may be the fourth field that specifies that a lookup operation is to be performed when a measure of sensitivity is less than a default threshold.

Save button 550, when selected by the operator, may cause the set up information to be saved to a memory associated with computing device 110. Edit button 552 may, when selected by the operator, allow the operator to modify set up information that has been previously saved. Exit button 554 may, when selected by the operator, cause TCE 120 to close user interface 500.

Example Process for Perform Performing a Fast Simulation

Figure 6:
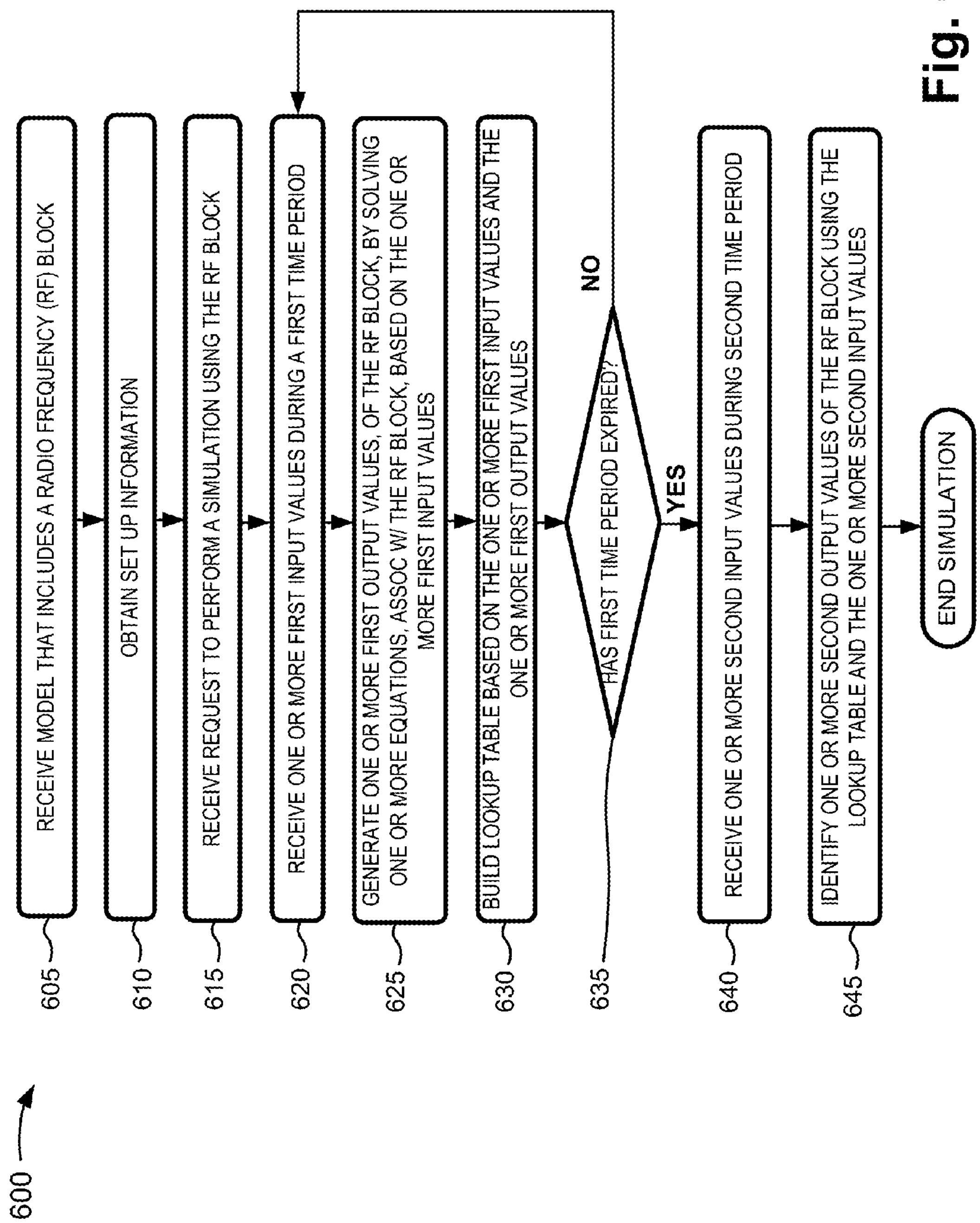
FIG. 6 is a flowchart of an example process for performing a simulation of a RF circuit based on executing a RF block and performing a lookup operation.

FIG. 6 is a flowchart of an example process for performing a simulation of a RF circuit based on executing RF block 320 and performing a lookup operation. In one implementation, process 600 may be performed by computing device 110. In another implementation, process 600 may be performed by a device, or a group of devices (e.g., worker 140, server 150, etc.), separate from, or in combination with, computing device 110.

As shown in FIG. 6, process 600 may include receiving a model that includes a RF block (block 605) and obtaining set up information (block 610). For example, an operator, of computing device 110, may desire to perform a simulation of a RF circuit and may instruct computing device 110 to obtain a model (e.g., Model 300) that includes RF block 320 associated with the RF circuit. Computing device 110 may, in response to the instruction, send a request to TCE 120 for the model with which to perform the simulation. TCE 120 may receive the request and may retrieve the model from data structure 115 and/or a memory associated with computing device 110. TCE 120 may provide the model to computing device 110. Computing device 110 may receive the model and may also, or alternatively, obtain set up information to be used to perform the simulation. In one example, computing device 110 may retrieve set up information from data structure 115 and/or the memory associated with computing device 110 that was previously provided by the operator. In another example, computing device 110 may provide, for display on computing device 110, user interface 500, via which the set up information may be entered by the operator and received by computing device 110.

As also shown in FIG. 6, process 600 may include receiving a request to perform a simulation using the RF block (block 615) and receiving one or more first input values during a first time period (block 620). For example, the operator may instruct computing device 110 to perform a simulation of the RF circuit using RF block 320 associated with model 300. In one example, the request may be received as result of the operator providing the request via a command line (e.g., by using a keyboard to type the command line) and/or by selecting a button or series of buttons on a user interface provided by TCE 120. Computing device 110 may receive the request and may obtain one or more first input values from RF source block 310 that represent instantaneous input signals at a first point in time (first time step) of the simulation.

As further shown in FIG. 6, process 600 may include generating one or more output values, of the RF block, by solving one or more equations, associated with the RF block, based on the one or more first input values (block 625) and building a lookup table based on the one or more first input values and the one or more first output values (block 630). For example, computing device 110 may provide the first input values to RF block 320. Computing device 110 may execute RF block 320, based on the first input values, by solving one or more mathematical equations associated with RF block 320. Computing device 110 may generate one or more first output values as a result of solving the mathematical equations based on the first input values. Computing device 110 may determine, based on the set up information, that the operator desires that a fast simulation be performed using a lookup table to be built based on the first input values and the first output values. Based on the determination that the set up information indicates that the fast simulation is to be performed using the lookup table, computing device 110 may store the first input values and the first output values within the table. Building the table will be described in greater detail below with respect to FIG. 7.

In another example, computing device 110 may not build the lookup table if the set up information indicates that the fast simulation is not to be performed. In this example, computing device 110 may simulate the RF circuit using RF block 320 and not building or using the lookup table. In yet another example, if the set up information indicates that a lookup table, that has been previously generated, is to be used to perform the simulation of the RF circuit, computing device 110 may use the previously generated lookup table, or a combination of the previously generated lookup table and/or RF block 320, to perform the simulation.

If the first time period has not expired (block 635—NO), then process 600 may include receiving another one or more first input values during the first time period (block 620). For example, computing device 110 may determine whether a time period, during which RF block 320 is being executed, is greater than a threshold specified by the set up information. Based on a determination that the time period is not greater than the threshold, computing device 110 may obtain another one or more first input values associated with a next time step of the simulation (e.g., a second time step, a third time step, etc.). Computing device 110 may provide the other first input values to RF block 320 and may execute RF block 320, based on the other first input values, by solving the mathematical equations associated with RF block 320. Computing device 110 may generate another one or more first output values as a result of solving the mathematical equations and may store the other first input values and the other first output values in the lookup table.

If the first time period has expired (block 635—YES), then process 600 may include receiving one or more second input values during a second time period (block 640) and identifying one or more second output values of the RF block using the lookup table and the one or more second input values (block 645). For example, computing device 110 may determine that the time period, during which RF block 320 is executing, is greater than the threshold specified by the set up information. Based on the determination that the time period is greater than the threshold, computing device 110 may obtain, from RF source block 310, one or more second input values associated with a next time step of the simulation.

Computing device 110 may identify one or more stored input values, within the lookup table, that most closely match the second input values. Based on the identification of the one or more stored input values, computing device 110 may identify one or more stored output values, within the lookup table, that correspond to the stored input values. Based on the identification of the stored output values, computing device 110 may output, to processing block 330 and as one or more second output values, the stored output values. Using the lookup table to identify the one or more second output values will be described in greater detail below with respect to FIGS. 11 and 12.

Figure 7:
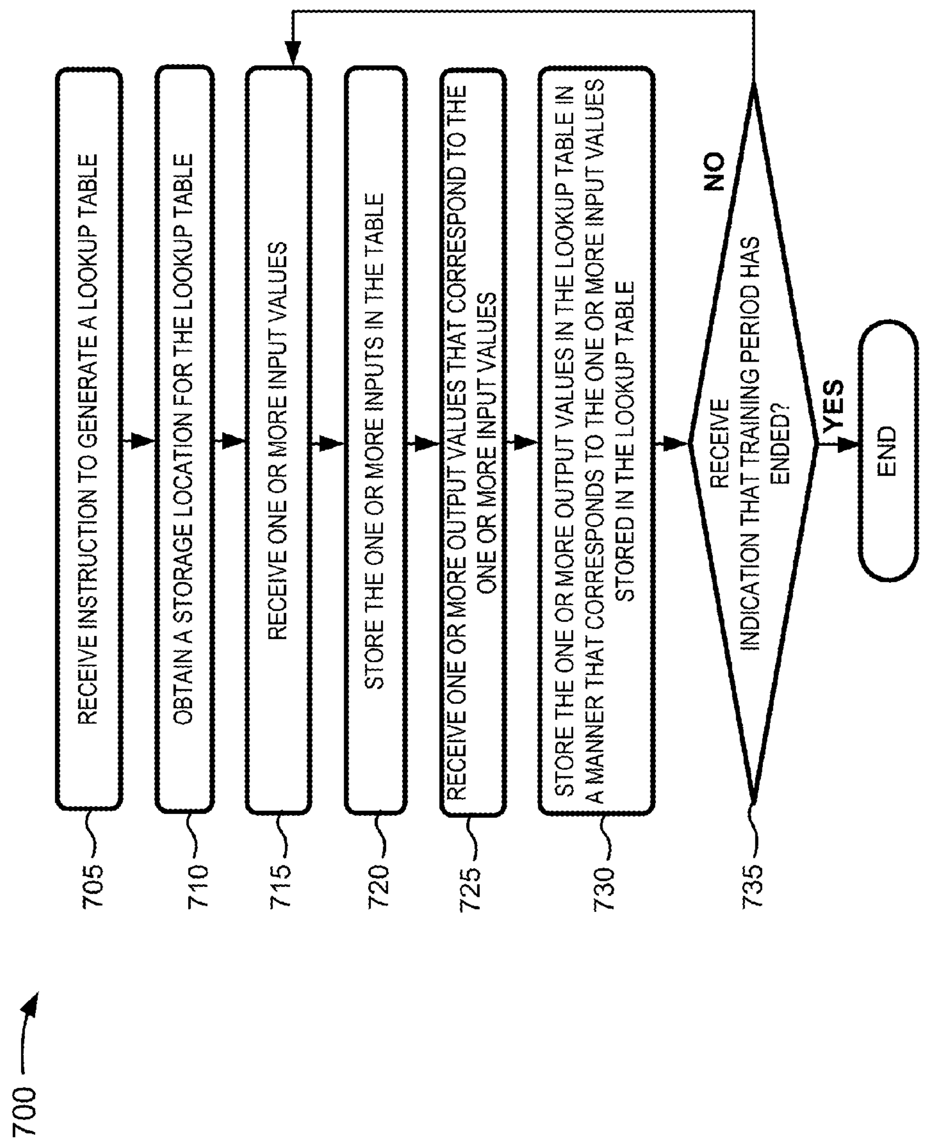
FIG. 7 is a flowchart of an example process for building a lookup table associated with performing a simulation of a RF circuit.

FIG. 7 is a flowchart of an example process 700 for building a lookup table associated with performing a simulation of a RF circuit. Process 700 may correspond to block 630 of FIG. 6. In one implementation, process 700 may be performed by computing device 110. In another implementation, process 700 may be performed by a device, or a group of devices (e.g., worker 140, server 150, etc.), separate from, or in combination with, computing device 110. FIG. 8 is diagram of an example lookup table 800 that may store input values to and/or output values from RF block 320. All or a portion of process 700, of FIG. 7, will be described below with references to lookup table 800 of FIG. 8.

As shown in FIG. 7, process 700 may include receiving an instruction to generate a lookup table (block 705) and obtaining a storage location for the lookup table (block 710). For example, computing device 110 may receive an instruction, via user interface 500 of FIG. 5, to perform a simulation in a manner that includes building and/or using a lookup table. The instruction may, in one example, be included within the set up information received via user interface 500. In another example, computing device 110 may determine that the set up information, retrieved from data structure 115 and/or a memory associated computing device 110, includes an indication that the simulation is to be performed in the manner that includes building and/or using the lookup table. Additionally, or alternatively, computing device 110 may obtain, from the set up information, information that identifies a storage location, within data structure 115 and/or the memory, at which the look up table is to be stored.

As also shown in FIG. 7, process 700 may include receiving one or more input values (block 715) and storing the one or more input values in the lookup table (block 720). For example, computing device 110 may, in a manner similar to that described above with respect to block 620 of FIG. 6, receive one or more input values to be provided to RF block 320 when performing the simulation. Computing device 110 may store the one or more input values in one or more entries associated with the lookup table, such as lookup table 800 of FIG. 8.

As shown in FIG. 8, lookup table 800 may include a set of fields, such as a frequency field 805, a time step field 810, an input field 815, and an output field 820. The quantity of fields, within lookup table 800, is included for explanatory purposes only. In another implementation, lookup table 800 may include additional fields, fewer fields, different fields, or differently arranged fields than are described with respect to FIG. 8.

Frequency field 805 may store information that identifies a frequency associated with an input signal to a RF circuit being simulated. An input signal, associated with multiple frequencies, may include multiple lookup tables 800 and/or respective sets of entries, associated with each of the multiple frequencies, within lookup table 800. Time step field 810 may store information that identifies a particular time step (e.g., a first time step, a tenth time step, a hundredth time step, a thousandth time step, etc.) associated with the simulation. Input field 815 may store one or more input values, associated with the particular time step, to be provided to RF block 320. The one or more input values may include parameters that correspond to an input signal, received by a RF circuit, at a point in time that corresponds to the particular time step. The parameters may, for example, correspond to an instantaneous amplitude, phase, polarization, quadrature angle, etc., associated with the input signal, at the point in time. Output field 820 may store one or more output values, associated with the particular time step, that are outputted by RF block 320. The one or more output values may include parameters that correspond to an output signal, generated by the RF circuit, at the point in time that corresponds to the particular time step.

Computing device 110 may, for example, store one or more first input values (e.g., X1), associated with a first time step (e.g., T1) of the simulation, in a first entry of lookup table 800 (e.g., as shown by ellipse 822 of FIG. 8).

As also shown in FIG. 7, process 700 may include receiving one or more output values that correspond to the one or more input values (block 725) and store the one or more output values in the lookup table in a manner that corresponds to the one or more input values stored in the lookup table (block 730). For example, computing device 110 may receive, from RF block 320 and as a result of solving the mathematical equations based on the one or more input values, one or more output values. Computing device 110 may store the one or more output values, in the lookup table, in a manner that corresponds to the one or more input values. For example, as shown in FIG. 8, computing device 110 may store the one or more output values (e.g., Y1) in an entry, associated with lookup table 800 of FIG. 8, that corresponds to the first input values and/or the first time step (e.g., as shown by ellipse 822 of FIG. 8).

If an indication that a training period has ended has not been received (block 735—NO), then process 700 may include receiving another one or more input values (block 715). For example, computing device 110 may not receive an indication that the training period has ended when a period of time, associated with building the lookup table, is not greater than a period of time identified by set up information associated with the simulation. Additionally, or alternatively, computing device 110 may not receive the indication that the training period has ended when a quantity of time steps, associated with building the lookup table, is not greater than a quantity of time steps identified by set up information associated with the simulation. Additionally, or alternatively, computing device 110 may not receive the indication that the training period has ended when a period of time, associated with building the lookup table, corresponds to a percentage of total simulation time that is not greater than a percentage of total time identified by the set up information associated with the simulation.

Computing device 110 may receive another one or more input values and may generate, using RF block 320, another one or more output values until the indicator is received indicating that the training period has ended. In an embodiment, computing device 100 may operate in a manner similar to that described above with respect to blocks 715 to 725 while waiting for the indicator. Computing device 110 may store, in lookup table 800 of FIG. 8, the other one or more input values (e.g., X2) and the next time step (e.g., T2) in another entry within lookup table 800 (e.g., as shown by ellipse 824 of FIG. 8). Additionally, or alternatively, computing device 110 may store the other one or more output values (e.g., Y2) in lookup table 800 in a manner that corresponds to the other one or more input values and/or the next time step (e.g., as shown by ellipse 824). Computing device 110 may, in a manner similar to that described above, continue to store further input values, time steps, and/or output values in lookup table 800 (e.g., as shown by ellipse 826 of FIG. 8) until an indication that the training period has ended has been received.

If the indication that the training period has ended has been received (block 735—YES), then process 700 may end. For example, computing device 110 may receive the indication that the training period has ended when the period of time, associated with building the lookup table, is greater than the period of time identified by set up information. Additionally, or alternatively, computing device 110 may receive the indication that the training period has ended when the quantity of time steps, associated with building the lookup table, is greater than the quantity of time steps identified by set up information. Additionally, or alternatively, computing device 110 may receive the indication that the training period has ended when the period of time, associated with building the lookup table, corresponds to the percentage of total simulation time that is greater than the percentage of total time identified by the set up information.

Based on the determination that the indication that the training period has ended has been received process 700 may end and/or the simulation may be performed using the lookup table and based on a lookup operation.

Figure 9:
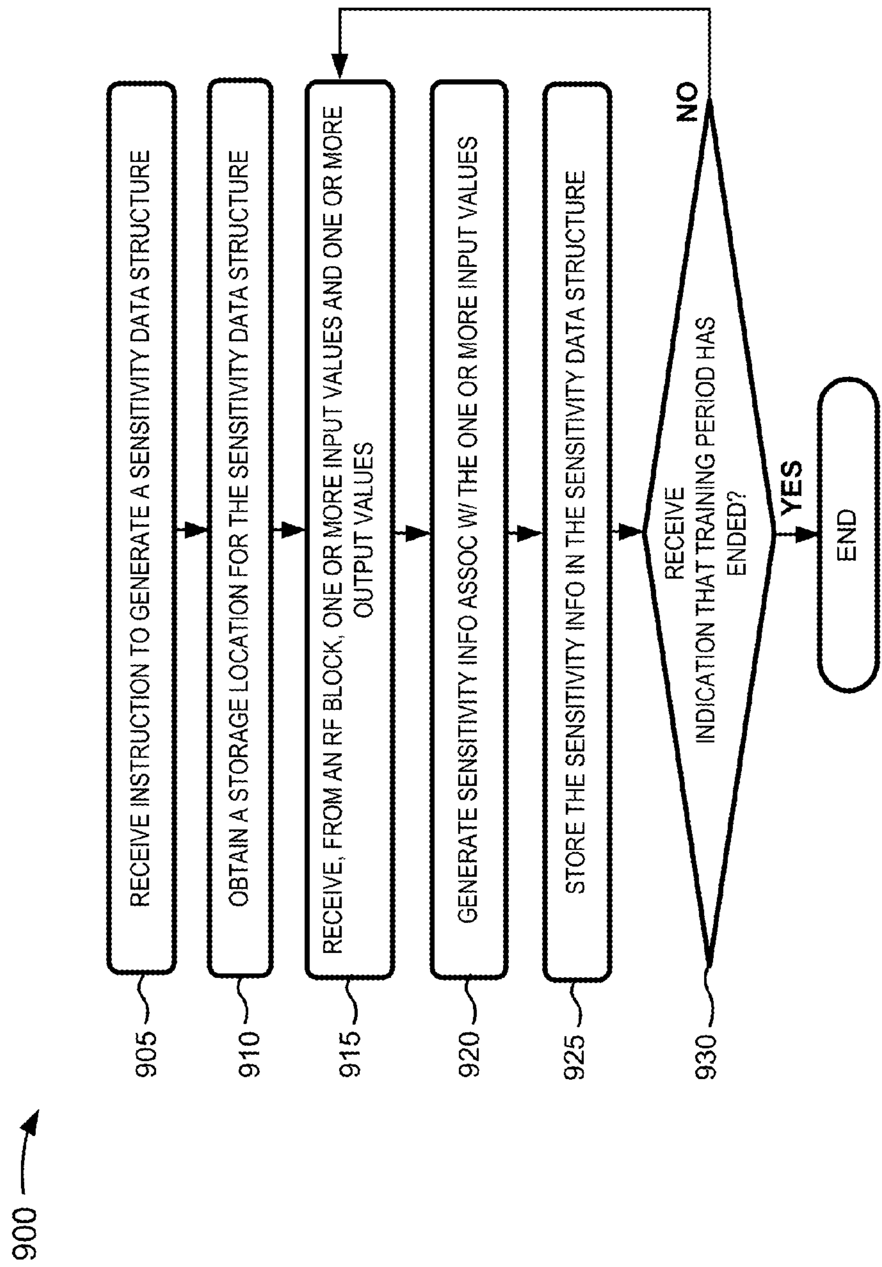
FIG. 9 is a flowchart of an example process for building a sensitivity data structure associated with a simulation of a RF circuit.
Figure 10:
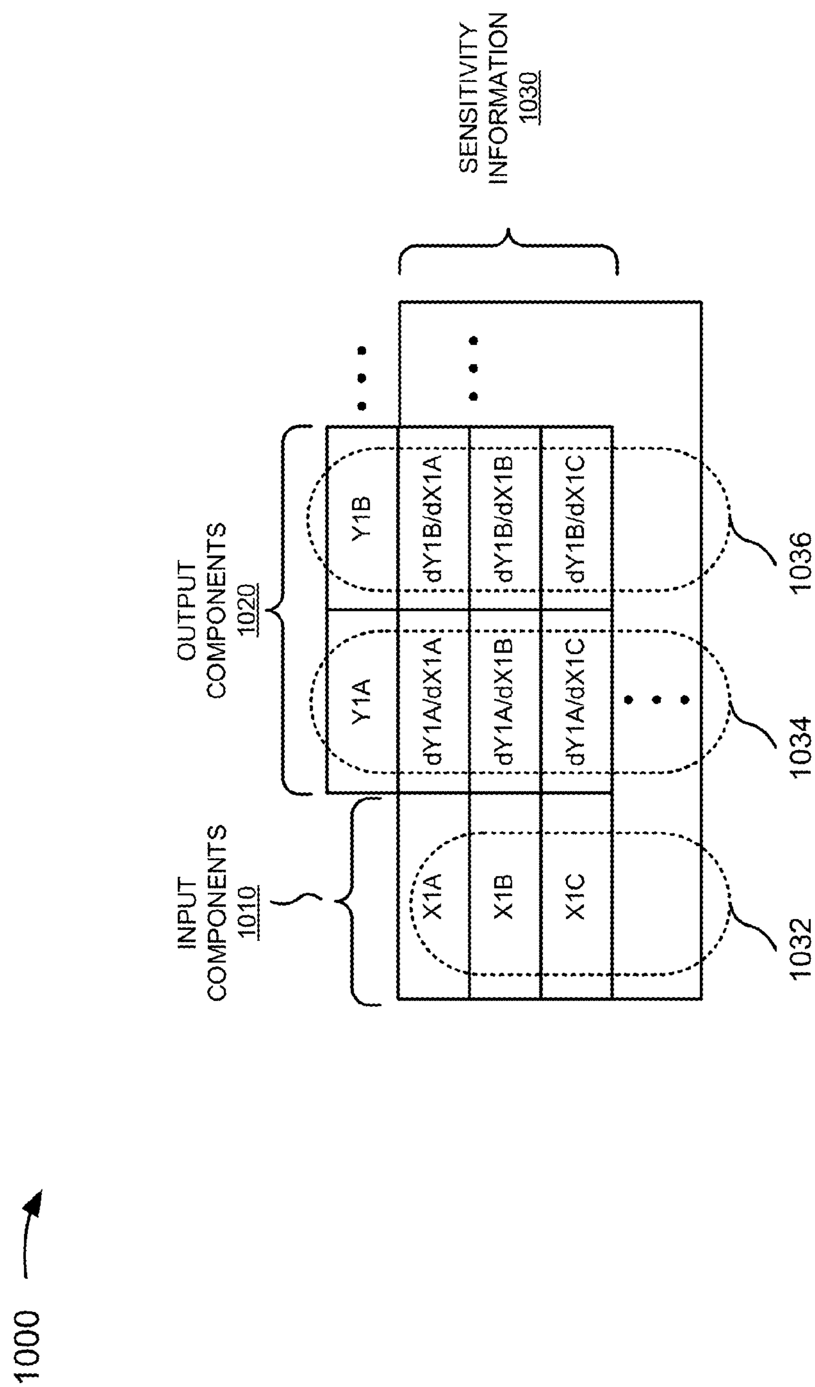
FIG. 10 is diagram of an example sensitivity data structure that may store sensitivity information associated with a simulation of a RF circuit.

FIG. 9 is a flowchart of an example process 900 for building a sensitivity data structure associated with a simulation of a RF circuit. In one implementation, process 900 may be performed by computing device 110. In another implementation, process 900 may be performed by a device, or a group of devices (e.g., worker 140, server 150, etc.), separate from, or in combination with, computing device 110. FIG. 10 is diagram of an example sensitivity data structure 1000 that may store sensitivity information associated with a simulation of a RF circuit. All or a portion of process 900, of FIG. 9, will be described below with references to sensitivity data structure 1000 of FIG. 10.

As shown in FIG. 9, process 900 may include receiving an instruction to generate a sensitivity data structure (block 905) and obtaining a storage location for the sensitivity data structure (block 910). For example, computing device 110 may receive an instruction, via user interface 500 of FIG. 5, to perform a simulation, of a RF circuit, in a manner that includes using a lookup table and sensitivity information. The instruction may be included within set up information received via user interface 500. In another example, computing device 110 may determine that the set up information, previously provided by the operator, includes an indication that the simulation is to be performed using the lookup table and the sensitivity information. Additionally, or alternatively, computing device 110 may obtain, from the set up information, information that identifies a storage location, within data structure 115 and/or a memory associated with computing device 110, at which the sensitivity information is to be stored. In one example, the sensitivity information may be stored within entries associated with the lookup table. In another example, the sensitivity information may be stored within a sensitivity data structure that is separate from the look up table.

As also shown in FIG. 9, process 900 may include receiving, from a RF block, one or more input values and one or more output values (block 915). For example, computing device 110 may receive one or more input values to RF block 320 and one or more output values from RF block 320, in a manner similar to that described above with respect to blocks 715 and 725 of FIG. 7, respectively. Computing device 110 may, in one example, store the one or more input values and/or the one or more output values in a lookup table in a manner similar to that described above with respect to blocks 720 and 730 of FIG. 7, respectively.

As further shown in FIG. 9, process 900 may include generating sensitivity information associated with the one or more input values (block 920) and storing the sensitivity information in the sensitivity data structure (block 925). For example, computing device 110 may generate sensitivity information, associated with the one or more input values, based on the one or more input values and the one or more output values. For example, computing device 110 may determine a rate of change, associated with a first output value (e.g., Y1) relative to a rate of change associated with a first input value (e.g., X1) with which the first output value is associated. Computing device 110 may determine the sensitivity information, associated with the first input value, by computing a first derivative of the first output value relative to a first derivative of the first input value (e.g., dY1/dX1, where dY1 is the first derivative of the first output value and where dX1 is the first derivative of the first input value). Computing device 110 may store the first input value, the first output value, and/or the sensitivity information in a sensitivity data structure, such as sensitivity data structure 1000 of FIG. 10.

As shown in FIG. 10, sensitivity data structure 1000 may include a set of fields, such as an input components field 1010, an output components field 1020, and a sensitivity information field 1030. The quantity of fields within sensitivity data structure 1000 is included for explanatory purposes only. In another implementation, sensitivity data structure 1000 may include additional fields, fewer fields, different fields, or differently arranged fields than are described with respect to FIG. 10.

Input components field 1010 may store each component associated with a particular input value to RF block 320. For example, components of the particular input value may include information that identifies values for an amplitude, a phase, a frequency, an in-phase component, a quadrature component, a quadrature angle, a polarization, etc. associated with the particular input value. Output components field 1020 may store each component associated with an output value, of RF block 320, that corresponds to the particular input value. For example, components of the output value may include information that identifies values for an amplitude, a phase, a frequency, an in-phase component, a quadrature component, a quadrature angle, a polarization, etc. associated with the output value.

Sensitivity information field 1030 may store sensitivity information based on the rate of change of each component of the output value relative to a rate of change of each component of the input value. For example, sensitivity information field 1030 may store a first derivative of a first component of the output value relative to a first derivative of a first component of the particular input value; a first derivative of the first component of the output value relative to a first derivative of a second component of the particular input value; and so on. Additionally, or alternatively, sensitivity information field 1030 may store a first derivative of a second component of the output value relative to the first derivative of the first component of the particular input value; the first derivative of the second component of the output value relative to the first derivative of the second component of the particular input value; and so on. Additionally, or alternatively, sensitivity information field 1030 may store other sensitivity information, in the manner described above, for each component of the output value.

By way of example, computing device 110 may generate sensitivity information, associated with the first input value (e.g., X1), based on computing a first derivative of each component of the first output value (e.g., Y1={Y1A, Y1B}, where Y1A is a first component of the first output value and Y1B is a second component of the first output value) relative to a first derivative of each component of the first input value (e.g., X1={X1A, X1B, X1C}, where X1A is a first component of the first input value, X1B is a second component of the first input value, and X1C is a third component of the first input value). The resulting sensitivity information may include a set of first derivatives based on a product of a first quantity of components (e.g., 2 input components) associated with the first input value and a second quantity of components associated with the first output value (e.g., 3 output components). In one example, the sensitivity information may represent a matrix (e.g., a 2×3 matrix) of the first derivative to the output components relative to the first derivative of each of the input components.

Computing device 110 may store, as sensitivity information, the set of first derivatives in sensitivity data structure 1000 of FIG. 10. For example, computing device 110 may store the components of the first input value (e.g., X1A, X1B, and X1C) in sensitivity data structure 1000 (e.g., as shown by ellipse 1032 of FIG. 10). Additionally, or alternatively, computing device 110 may generate first derivatives of the first component of the first output value relative to first derivatives of each of the components of the first input value (e.g., dY1A/dX1A, dY1A/dX1B, and dY1A/dX1C). Computing device 110 may store the first component of the first output value and the first derivatives of the first component of the first output value in sensitivity data structure 1000 (e.g., as shown by ellipse 1034). Additionally, or alternatively, computing device 110 may generate first derivatives of the second component of the first output value relative to first derivatives of each of the components of the first input value (e.g., dY1B/dX1A, dY1B/dX1B, and dY1B/dX1C). Computing device 110 may store the second component of the first output value and the first derivatives of the second component of the first output value in sensitivity data structure 1000 (e.g., as shown by ellipse 1036).

If an indication that a training period has ended has not been received (block 930—NO), then process 900 may include receiving, from the RF block, another one or more input values and another one or more output values (block 915). For example, computing device 110 may, in a manner similar to that described above with respect to block 735 of FIG. 7, not receive an indication that the training period has ended when a period of time, associated with building the lookup table, is not greater than a period of time identified by set up information; when a quantity of time steps, associated with building the table, is not greater than a quantity of time steps identified by set up information; and/or when a period of time, associated with building the table, corresponds to a percentage of total simulation time that is not greater than a percentage of total time identified by the set up information.

Based on the determination that the indication, that the training period has ended, has not been received, computing device 110 may receive another one or more input values to and/or another one or more output values from RF block 320 in a manner similar to that described above with respect to block 915. Computing device 110 may generate sensitivity information based on the other one or more input values and/or the other one or more output values and may store the sensitivity information, the other one or more input values, and/or the other one or more output values in the sensitivity data structure (e.g., sensitivity data structure 1000 of FIG. 10). Computing device 110 may, in a manner similar to that described above, continue to receive input values and/or output values, generate sensitivity information based on the input values and/or output values, and/or store the sensitivity information, the input values, and/or the output values in the sensitivity data structure until the indication, that the training period has ended, has been received.

If the indication that the training period has ended has been received (block 930—YES), then process 900 may end. For example, computing device 110 may receive the indication that the training period has ended when the period of time, associated with building the table, is greater than the period of time identified by set up information; when the quantity of time steps, associated with building the table, is greater than the quantity of time steps identified by set up information; and/or when the period of time, associated with building the table, corresponds to the percentage of total simulation time that is greater than the percentage of total time identified by the set up information.

Based on the determination that the indication that the training period has ended has been received, process 900 may end and/or the simulation may be performed using the lookup table and/or the sensitivity data structure and based on a lookup operation.

Figure 11:
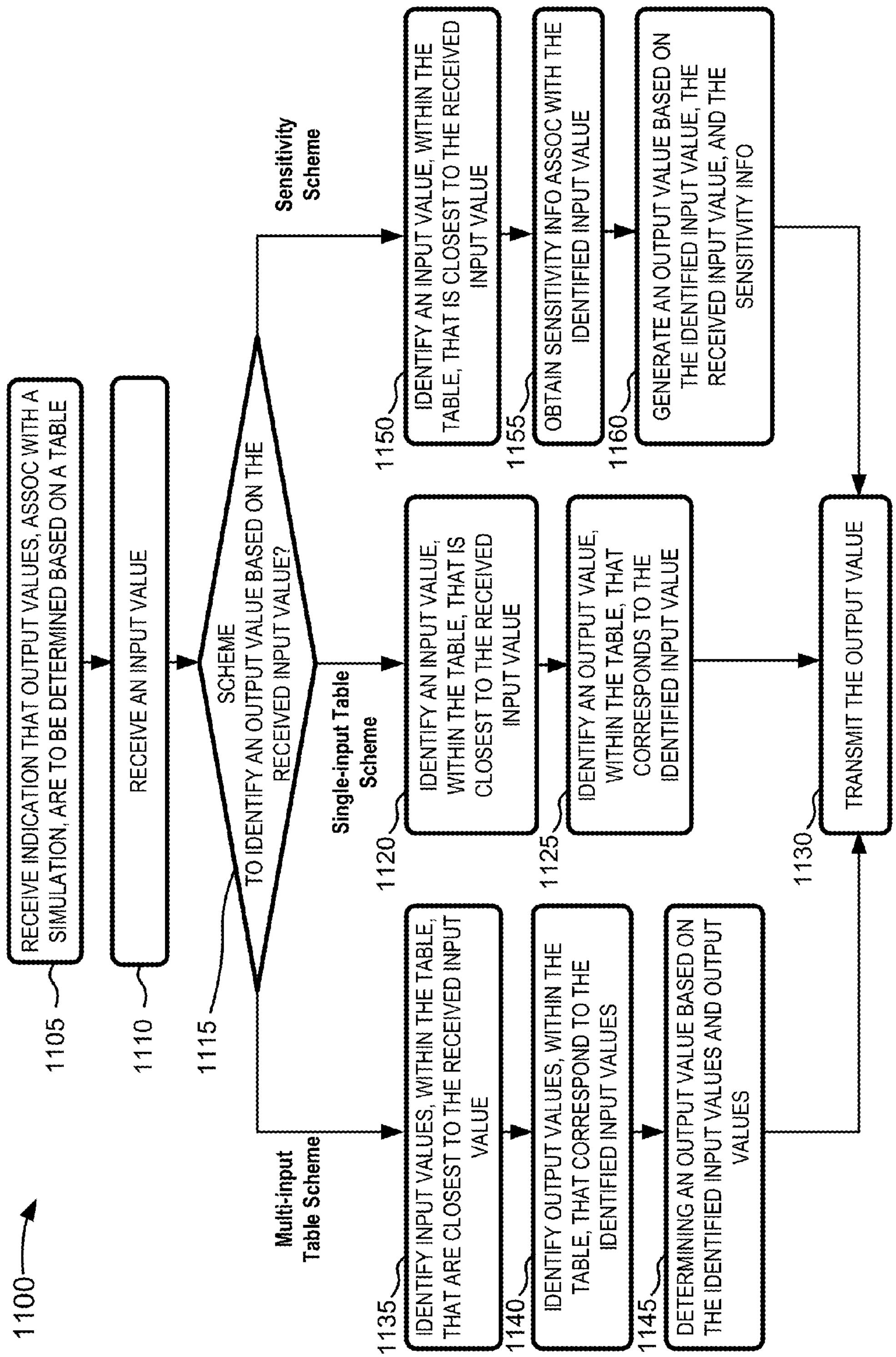
FIG. 11 is a flow chart of an example process for performing a simulation of a RF circuit using a lookup table and/or a sensitivity data structure.

FIG. 11 is a flow chart of an example process 1100 for performing a simulation of a RF circuit using a lookup table and/or a sensitivity data structure. Process 1100 may correspond to block 645 of FIG. 6. In one implementation, process 1100 may be performed by computing device 110. In another implementation, process 1100 may be performed by a device, or a group of devices (e.g., worker 140, server 150, etc.), separate from, or in combination with, computing device 110. Assume, in the description below, that a lookup table has been generated in a manner similar to that described above with respect to FIG. 7. Assume further that sensitivity information has been generated in a manner similar to that described above with respect to FIG. 9.

As shown in FIG. 11, process 1100 may include receiving an indication that output values are to be determined based on a lookup table (block 1105) and receiving an input value (block 1110). For example, in a manner similar to that described above with respect to block 735—YES of FIG. 7, computing device 110 may receive an indication that output values, associated with a simulation of a RF circuit using RF block 320, are to be generated, using a lookup table. Additionally, or alternatively, the indication may identify that the output values are to be generated using the lookup table when a period of time, associated with building the lookup table, is greater than a period of time identified by set up information associated with the simulation. Additionally, or alternatively, computing device 110 may receive an indication that output values are to be generated, using the lookup table, when a quantity of time steps, associated with building the table, is greater than a quantity of time steps identified by set up information associated with the simulation. Additionally, or alternatively, computing device 110 may receive an indication that that output values are to be generated, using the lookup table, when a period of time, associated with building the table, corresponds to a percentage of total simulation time that is greater than a percentage of total time identified by the set up information associated with the simulation.

Based on the determination that the indication, that output values are to be generated using the lookup table, has been received, computing device 110 may receive an input value from RF source block 310.

As shown in FIG. 11, if a scheme to identify an output value based on the received input value is based on a single-input table scheme (block 1115—Single-input Table Scheme), then process 1100 may include identifying an input value, within the table, that is closest to the received input value (block 1120). For example, computing device 110 may determine that a single-input table scheme is to be used to identify an output value based on predetermined settings associated with TCE 120 and/or computing device 110. Additionally, or alternatively, computing device 110 may determine that the single-input table scheme is to be used based on set up information specified by an operator of computing device 110.

Based on the determination that the single-input table scheme is to be used, computing device 110 may compare the received input value to input values stored within the lookup table. Computing device 110 may, in one example, identify an input value stored within the lookup table, that matches the received input value. In another example, computing device 110 may determine distances between the received input value and the input values stored within the lookup table. Computing device 110 may select an input value, stored within the lookup table, that corresponds to a shortest distance. For example, each of the distances may be generated, by computing device 110, based on a respective distance (e.g., based on a Euclidean distance, etc.) between the received input value and each of the input values stored within the table (e.g., distance=((X1A−XTA)^2+(X1B−XTB)^2)^½, where X1A and X1B are components of the received input value and XTA and XTB are components of an input value stored within the lookup table).

As further shown in FIG. 11, process 1100 may include identifying an output value, within the table, that corresponds to the identified input value (block 1125) and transmitting the output value (block 1130). For example, computing device 110 may identify an output value, within the lookup table, that corresponds to the selected input value and may transmit the identified output value to processing block 330.

As also shown in FIG. 11, if the scheme to identify an output value based on the received input value is based on a multi-input table scheme (block 1115—Multi-input Table Scheme), then process 1100 may include identifying input values, within the table, that are closest to the received input value (block 1135). For example, computing device 110 may determine that a multi-input table scheme is to be used to identify an output value based on predetermined settings, associated with TCE 120 and/or computing device 110 and/or the set up information specified by an operator of computing device 110.

Based on the determination that the multi-input table scheme is to be used, computing device 110 may compare the received input value to input values stored within the lookup table. Computing device 110 may, in a manner similar to that described above, determine distances between the received input value and the input values stored within the lookup table. Computing device 110 may select two input values, stored within the lookup table, that correspond to shortest distances.

As still further shown in FIG. 11, process 1100 may include identifying output values, within the table, that correspond to the identified input values (block 1140); determining an output value based on the identified input values and output values (block 1145); and transmitting the output value (block 1130). For example, computing device 110 may identify two output values, stored within the lookup table, that correspond to the identified input values stored within the lookup table. Computing device 110 may also, or alternatively, identify a range between the two output values. The range between the two output values may be based on a first range between first components of the identified output values (e.g., between Y1A and Y2A, where Y1A represents a first component of a first identified output value and Y2A represents a first component of a second identified output value), a second range between second components of the identified output values (e.g., between Y1B and Y2B, where Y1B represents a second component of the first identified output value and Y2B represents a second component of the second identified output value), etc.

Computing device 110 may generate an output value that falls within the range of the two identified output values (e.g., a midpoint of the range or some other point within the range). For example, the generated output value may include a first component that falls within the first range, a second component that falls within the second range, etc. Computing device 110 may transmit the generated output value to processing block 330.

As also shown in FIG. 11, if the scheme to identify an output value based on the received input value is based on a sensitivity scheme (block 1115—Sensitivity Scheme), then process 1100 may include identifying an input value, within the table, that is closest to the received input value (block 1150) and obtaining sensitivity information associated with the identified input value (block 1155). For example, computing device 110 may determine that a sensitivity scheme is to be used to identify an output value based on predetermined settings, associated with TCE 120 and/or computing device 110 and/or the set up information specified by an operator of computing device 110.

Based on the determination that the sensitivity scheme is to be used, computing device 110 may, in a manner similar to that described above with respect to block 1120, identify an input value, stored within the lookup table, associated with a shortest distance to the received input value. Additionally, or alternatively, computing device 110 may obtain, from a sensitivity data structure, sensitivity information (e.g., M1) associated with the identified input value (e.g., X1). The sensitivity information may, in a manner similar to that described above with respect to FIG. 9, include one or more first derivatives of an output value, within the lookup table, that corresponds to the identified input value.

As further shown in FIG. 11, process 1100 may include generating an output value based on the identified input value, the received input value, and the sensitivity information (block 1160) and transmitting the output value (block 1130). For example, computing device 110 may generate an output value (e.g., YR), associated with the received input value (e.g., XR), based on a sum of the identified input value and a quantity defined by a product of the sensitivity information multiplied by a difference between the received input value and the identified input value (e.g., YR=X1+M1*(X1−XR)). Computing device 110 may transmit the generated output value to processing block 330.

FIG. 12 is a flow chart of an example process 1200 for performing a simulation of a RF circuit with dynamic lookup table updating based on sensitivity information. In one implementation, process 1200 may be performed by computing device 110. In another implementation, process 1200 may be performed by a device, or a group of devices (e.g., worker 140, server 150, etc.), separate from, or in combination with, computing device 110.

Assume, in the description below and in a manner similar to that described above with respect to blocks 605-615 of FIG. 6, that computing device 110 obtains, from TCE 120, a model, that includes RF block 320, in response to an instruction from an operator of computing device 110. Assume further that computing device 110 obtains set up information, associated with a simulation of a RF circuit, that indicates that output values are to be dynamically generated, using the lookup table, when changes between consecutive input values are less than a threshold. Assume still further that computing device 110 initiates the simulation in response to a request, from the operator, to perform the simulation using RF block 320.

As shown in FIG. 12, process 1200 may include receiving a first input value (block 1210) and generating a first output value, of the RF block, by solving one or more mathematical equations based on the first input value (block 1215). For example, computing device 110 may receive a first input value, from RF source block 310, and may provide the first input value to RF block 320. Computing device 110 may, in a manner similar to that described above with respect to block 625 of FIG. 6, execute RF block 320 to solve one or more mathematical equations, associated with RF block 320 and based on the first input value, to generate a first output value.

As also shown in FIG. 12, process 1200 may include generating a table based on the first input value and the first output value (block 1220) and generating sensitivity information associated with the first input value and storing the sensitivity information in a sensitivity data structure (block 1225). For example, computing device 110 may, in a manner similar to that described above with respect to block 920 and 925 of FIG. 9, generate sensitivity information, associated with the first input value by computing one or more first derivatives of components of the first output value with respect to one or more first derivatives of components of the first input value. Additionally, or alternatively, computing device 110 may store, in a sensitivity data structure, the first input value, the first output value, and/or the sensitivity information associated with the first input value.

As further shown in FIG. 12, process 1200 may include receiving a second input value (block 1230), identifying distances between the second input value and input values stored within the table (block 1235), and identifying an input value, stored within the table, associated with a closest distance to the second input value (block 1240). For example, computing device 120 may, in a manner similar to that described above with respect to blocks 1120 and 1125 of FIG. 11, determine distances between the second input value and input values stored within the lookup table. Computing device 110 may also, or alternatively, identify a closest distance among the distances and may identify an input value, stored within the lookup table, to which the shortest distance corresponds.

If the closest distance is greater than a threshold (block 1245—YES), then process 1200 may include generating a second output value by solving the one or more equations based on the second input value (block 1250) and transmitting the second output value (block 1255). For example, computing device 110 may determine whether the closest distance is greater than a threshold. Based on a determination that the closest distance is greater than the threshold, computing device 110 may provide the second input value to RF block 320. Additionally, or alternatively, computing device 110 may, in a manner similar to that described above with respect to block 625 of FIG. 6, execute RF block 320 to solve the one or more mathematical equations, based on the second input value, to generate a second output value. Computing device 110 may transmit the second output value to processing block 330.

If the closest distance is not greater than the threshold (block 1245—NO), then process 1200 may include generating a second output value based on sensitivity information associated with the identified input value (block 1260) and transmitting the second output value (block 1255). For example, computing device 110 may determine that the closest distance is not greater than the threshold. Based on the determination that the closest distance is not greater than the threshold, computing device 110 may obtain, from a sensitivity data structure, sensitivity information associated with the identified input value associated with the closest distance. Additionally, or alternatively, computing device 110 may, in a manner similar to that described above with respect to block 1160 of FIG. 11, generate a second output value based on the second input value, the identified input value and the sensitivity information associated with the identified input value. Computing device 110 may, for example, generate the second output value (e.g., Y2) based on a sum of the identified input value (e.g., XT) and a quantity defined by a product of the sensitivity information (e.g., MT) multiplied by a difference between the second input value (e.g., X2) and the identified input value (e.g., Y2=XT+MT*(X2−XT)). Computing device 110 may transmit the second output value to processing block 330.

CONCLUSION

A system and/or method may allow operation of a radio frequency (RF) circuit to be simulated, by a technical computing environment (TCE), using a mathematical model that is based on a RF block. The operation of the RF circuit may also be simulated, by the TCE, using a lookup table that stores input values to, and/or output values from, the RF block.

The TCE may, during a lookup phase of the simulation, simulate the operation of the RF circuit by performing a lookup operation using the lookup table. The TCE may receive an input value and may identify a stored input value, within the lookup table, that corresponds to the received input value. Based on the identification of the stored input value, the TCE may identify a stored output value, within the lookup table, associated with the stored input value. Performing the simulation based on the lookup operation may be performed in less time than performing the simulation based on solving the mathematical equations. In this way, the amount of time to simulate the operation of the RF circuit may be reduced.

The TCE may, during the training phase, generate sensitivity information based on input values to the RF block and corresponding output values from the RF block. The TCE may cause the simulation to dynamically change from the training phase, to the lookup phase, when the measure of sensitivity is less than a threshold. Additionally, or alternatively, the TCE may cause the simulation to dynamically change from the lookup phase, to the training phase, when the measure of sensitivity is not less than a threshold.

The foregoing description provides illustration and description, but is not intended to be exhaustive or to limit the description to the precise form disclosed. Modifications and variations are possible in light of the above embodiments or may be acquired from practice of the implementations.

While series of blocks have been described with regard to FIGS. 6, 7, 9, 11, and 12, the order of the blocks may be modified in other embodiments. Further, non-dependent blocks may be performed in parallel.

It will be apparent that embodiments, as described herein, may be implemented in many different forms of software, firmware, and hardware in the embodiments illustrated in the figures. The actual software code or specialized control hardware used to implement embodiments described herein is not limiting of the embodiments. Thus, the operation and behavior of the embodiments were described without reference to the specific software code—it being understood that software and control hardware may be designed to implement the embodiments based on the description herein.

Further, certain portions, described above, may be implemented as a component or logic that performs one or more functions. A component or logic, as used herein, may include hardware, such as a processor, ASIC, or FPGA, or a combination of hardware and software (e.g., a processor executing software).

Even though particular combinations of features are recited in the claims and/or disclosed in the specification, these combinations are not intended to limit the disclosure of the embodiments. In fact, many of these features may be combined in ways not specifically recited in the claims and/or disclosed in the specification.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A computing device-implemented method comprising:

generating a first output value of a radio frequency (RF) block by solving a differential equation, associated with the RF block, using a first input value, the RF block being included in an executable model, and the generating being performed by the computing device;

generating sensitivity information, associated with the first input value, based on a rate of change of the first output value relative to a rate of change associated with the first input value, the generating the sensitivity information being performed by the computing device;

constructing a look-up table based on the first output value and the first input value, the constructing being performed by the computing device;

determining whether an event has been detected, the determining being performed by the computing device;

generating a second output value by solving the differential equation using a second input value when the event has not been detected, the event being associated with an expiration of a time interval or a quantity, associated with at least one of the first input value and the second input value or the first output value and the second output value, being greater than a particular threshold, the time interval being specified by a user of the computing device, the first input value and the second input value being associated with a first threshold, the first output value and the second output value being associated with a second threshold, and the generating the second output value being performed by the computing device;

determining a third output value, of the RF block, using the look-up table and a third input value when the event has been detected, the determining the third output value being performed by the computing device; and simulating the RF block using the look-up table and the sensitivity information.

2. The method of claim 1, where the differential equation models a manner in which one or more components, associated with a RF circuit that is represented by the RF block, perform based on one or more input values.

3. The method of claim 1, where constructing the look-up table further includes:

associating, in a memory associated with the computing device, the first input value with the first output value.

4. The method of claim 3, further comprising:

storing, in the memory, a first time step, associated with performing the simulation, that corresponds to the first input value or the first output value.

5. The method of claim 1, further comprising:

storing the sensitivity information in a memory associated with the computing device.

6. The method of claim 5, where storing the sensitivity information further includes:

associating, in the look-up table, the sensitivity information with the first input value and the first output value.

7. The method of claim 1, further comprising:

obtaining a further first input value;

identifying a fourth input value, of one or more input values that are stored in the look-up table, that most closely matches the second input value;

retrieving sensitivity information associated with the fourth input value that most closely matches the second input value; and determining a fourth output value based on the second input value, the fourth input value, and the sensitivity information.

8. The method of claim 1, where determining the third output value further includes:

comparing the second input value to one or more input values stored within the look-up table;

determining that the second input value most closely matches a fourth input value of the one or more input values;

identifying that an output value, of one or more output values stored within the look-up table, corresponds to the fourth input value of the one or more input values; and outputting the output value, of the one or more output values, as a fourth output value.

9. The method of claim 1, where determining the third output value further includes:

determining one or more distance values between the second input value and one or more input values within the look-up table;

identifying a first distance value, of the one or more distance values, and a second distance value, of the one or more distance values, that are less than another one of the distance values included in the one or more distance values;

identifying a fourth input value, of the one or more input values within the look-up table, and a fifth input value, of the one or more input values within the look-up table, that correspond to the first distance value and the second distance value, respectively;

obtaining, from the look-up table, a fourth output value, of one or more output values stored within the look-up table, that corresponds to the fourth input value;

obtaining, from the look-up table, a fifth output value, of the one or more output values stored within the look-up table, that corresponds to the fifth input value; and generating the third output value based on the third output value falling within a range defined by the fourth output value and the fifth output value.

10. One or more non-transitory computer-readable media storing instructions, the instructions comprising:

one or more instructions, executable by at least one processor, to cause the at least one processor to:

determine, during a first time period, one or more first output values, of an RF circuit, by solving one or more differential equations using one or more first input values;

build, during the first time period, a table based on the one or more first input values and the one or more first output values;

receive, during a second time period, one or more second input values for the RF circuit;

determine, during the second time period and when an event has been detected, one or more second output values, of the RF circuit, using the table and the one or more second input values;

the event being associated with an expiration of a time interval or a quantity, associated with at least one of the one or more first input value, the one or more second input values, the one or more first output values and the one or more second output values, being greater than a particular threshold, the time interval being specified by a user, the one or more first input values and the one or more second input values being associated with a first threshold, and the one or more first output values and the one or more second output values being associated with a second threshold, generate sensitivity information associated with the one or more first input values;

determine a second output value, of the one or more second output values, based on:

a second input value of the one or more second input values, a first input value, of the one or more first input values that are stored in the table, that most closely matches the second input value, and the sensitivity information; and use the determined second output value to perform an operation.

11. The one or more non-transitory computer-readable media of claim 10, where the instructions further comprise:

one or more instructions to receive an indication that the first time period has expired; and one or more instructions to determine that output values are no longer to be determined based on solving the one or more differential equations.

12. The one or more non-transitory computer-readable media of claim 10, where the instructions further comprise:

one or more instructions to store, in the table, the one or more first input values; and one or more instructions to store, in the table and in a manner that corresponds to the one or more first input values, the one or more first output values.

13. The one or more non-transitory computer-readable media of claim 10, where the one or more instructions to determine the one or more second output values include:

one or more instructions to identify, using the table, the first input value, of the one or more first input values stored in the table, that most closely matches the second input value of the one or more second input values;

one or more instructions to identify, using the table, a first output value, of the one or more first output values stored in the table, that corresponds to the first input value; and one or more instructions to output, as a second output value, of the one or more second output values, the first output value.

14. The one or more non-transitory computer-readable media of claim 10, where the one or more instructions to determine the one or more second output values comprise:

one or more instructions to identify a plurality of distance values between at least one second input value, of the one or more second input values, and a plurality of first input values that are stored in the table;

one or more instructions to select two or more lowest distance values, of the plurality of distance values, that are less than any other distance values, of the plurality of distance values;

one or more instructions to identify two or more first input values, of the plurality of first input values that are stored in the table, that correspond to the selected two or more lowest distance values;

one or more instructions to obtain, from the table, two or more first output values, of a plurality of first output values that are stored in the table, that correspond to the two or more first input values; and one or more instructions to determine a second output value, of the one or more second output values, based on the two or more first output values.

15. The one or more non-transitory computer-readable media of claim 14, where the instructions further comprise:

one or more instructions to perform an interpolation to identify the second output value, where the interpolation is based on the at least one second input value, the two or more first input values, and the two or more first output values.

16. The one or more non-transitory computer-readable media of claim 10, where the sensitivity information identifies a rate of change, associated with the one or more first output values, relative to a rate of change associated with the one or more first input values.

17. The one or more non-transitory computer-readable media of claim 10, where the instructions further comprise:

one or more instructions to determine one or more distance values between at least one second input value, of the one or more second input values, and the one or more first input values that are stored in the table;

one or more instructions to identify at least one first input value, of the one or more first input values that are stored in the table, associated with a lowest distance value, of the one or more distance values, between the at least one second input value and the at least one first input value;

one or more instructions to determine an output value using the table when the lowest distance value is less than a threshold; and one or more instructions to determine an output value by solving the one or more differential equations when the lowest distance value is not less than the threshold.

18. A computing device comprising:

one or more processors to:

receive a model that includes a radio frequency (RF) block, the RF block being associated with one or more equations;

generate one or more first output values, during a time period and as a result of simulating the RF block, by solving the one or more equations using one or more first input values, a first input value, of the one or more first input values, including a first component and a second component, the first component being associated with an amplitude, a phase, a frequency, an in-phase component, a quadrature component, a quadrature angle, or a polarization, the second component being associated with an amplitude, a phase, a frequency, an in-phase component, a quadrature component, a quadrature angle, or a polarization, a first output value, of the one or more first output values and that corresponds to the first input value, including a third component and a fourth component;

store, in a table, the one or more first input values and the one or more first output values;

generate sensitivity information that identifies a rate of change of the one or more first output values relative to the one or more first input values over the time period, the sensitivity information including at least one of:

a first sensitivity value based on a first derivative of the third component relative to a first derivative of the first component, a second sensitivity value based on the first derivative of the third component relative to a first derivative of the second component, a third sensitivity value based on a first derivative of the fourth component relative to the first derivative of the first component, and a fourth sensitivity value based on a first derivative of the fourth component relative to the first derivative of the second component;

store the sensitivity information;

obtain a second input value after the time period;

identify a first input value, of the one or more first input values that are stored in the table, that most closely matches the second input value;

retrieve, from the stored sensitivity information, sensitivity information associated with the first input value;

compute a second output value, as a result of simulating the RF block, based on the second input value, the table, and the retrieved sensitivity information;

simulate the RF block using the table and the retrieved sensitivity information;

generate, based on simulating the RF block and when the retrieved sensitivity information indicates that a rate of change associated with the second output value is greater than a threshold, another second output value by solving the one or more equations using the second input value; and forward the second output value or the other second output value based on whether the sensitivity information indicates that the rate of change of the second output value is greater than the threshold.

19. The device of claim 18, where the one or more processors are further to:

generate a sensitivity matrix based on the first sensitivity value, the second sensitivity value, the third sensitivity value, and the fourth sensitivity value, where dimensions of the sensitivity matrix are based on:

a quantity of components associated with the first input value, and a quantity of components associated with the first output value.

20. The device of claim 18, where, when computing the second output value, the one or more processors are further to:

add the first input value to a first quantity that is determined by multiplying the sensitivity information, associated with the first input value, by a second quantity defined by subtracting the first input value from the second input value.

21. The device of claim 18, where the one or more equations include at least one differential equation, and where the one or more equations are represented by one or more blocks associated with the RF block.

* * * * *